(12) United States Patent
Wu et al.

(10) Patent No.: US 11,996,353 B2
(45) Date of Patent: May 28, 2024

(54) AIR GAP SEAL FOR INTERCONNECT AIR GAP AND METHOD OF FABRICATING THEREOF

(71) Applicant: Taiwan Semiconductor Manufacturing Co., Ltd., Hsin-Chu (TW)

(72) Inventors: Xusheng Wu, Hsinchu (TW); Youbo Lin, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/739,826

(22) Filed: May 9, 2022

(65) Prior Publication Data

US 2022/0262708 A1    Aug. 18, 2022

Related U.S. Application Data

(62) Division of application No. 16/817,111, filed on Mar. 12, 2020, now Pat. No. 11,328,982.

(60) Provisional application No. 62/868,012, filed on Jun. 28, 2019.

(51) Int. Cl.
| | |
|---|---|
| *H01L 23/482* | (2006.01) |
| *H01L 21/764* | (2006.01) |
| *H01L 21/768* | (2006.01) |
| *H01L 23/498* | (2006.01) |
| *H01L 29/417* | (2006.01) |
| *H01L 29/49* | (2006.01) |

(52) U.S. Cl.
CPC ........ *H01L 23/4821* (2013.01); *H01L 21/764* (2013.01); *H01L 21/76832* (2013.01); *H01L 23/49833* (2013.01); *H01L 23/49894* (2013.01); *H01L 29/41775* (2013.01); *H01L 29/4991* (2013.01); *H01L 2221/1042* (2013.01)

(58) Field of Classification Search
CPC .......... H01L 29/41775; H01L 29/4991; H01L 21/764; H01L 21/7682; H01L 2221/1042
See application file for complete search history.

(56) References Cited

U.S. PATENT DOCUMENTS

| | | |
|---|---|---|
| 9,716,158 B1 | 7/2017 | Cheng et al. |
| 2005/0230836 A1 | 10/2005 | Clarke et al. |
| 2008/0182405 A1 | 7/2008 | Liu et al. |

(Continued)

*Primary Examiner* — Jesse Y Miyoshi
(74) *Attorney, Agent, or Firm* — Haynes and Boone, LLP

(57) ABSTRACT

Interconnects that facilitate reduced capacitance and/or resistance and corresponding techniques for forming the interconnects are disclosed herein. An exemplary interconnect is disposed in an insulating layer. The interconnect has a metal contact, a contact isolation layer surrounding sidewalls of the metal contact, and an air gap disposed between the contact isolation layer and the insulating layer. An air gap seal for the air gap has a first portion disposed over a top surface of the contact isolation layer, but not disposed on a top surface of the insulating layer, and a second portion disposed between the contact isolation layer and the insulating layer, such that the second portion surrounds a top portion of sidewalls of the metal contact. The air gap seal may include amorphous silicon and/or silicon oxide. The contact isolation layer may include silicon nitride. The insulating layer may include silicon oxide.

20 Claims, 9 Drawing Sheets

(56) References Cited

U.S. PATENT DOCUMENTS

| | | | |
|---|---|---|---|
| 2012/0168899 A1* | 7/2012 | Kim | H01L 21/76897 438/586 |
| 2013/0248950 A1* | 9/2013 | Kang | H01L 29/66545 257/288 |
| 2015/0243544 A1* | 8/2015 | Alptekin | H01L 21/7682 438/586 |
| 2020/0126843 A1* | 4/2020 | Tsai | H01L 21/76897 |
| 2020/0411415 A1 | 12/2020 | Wu et al. | |

* cited by examiner

AIR GAP SEAL FOR INTERCONNECT AIR GAP AND METHOD OF FABRICATING THEREOF

The present application is a divisional application of U.S. patent application Ser. No. 16/817,111, filed Mar. 12, 2020, which is a non-provisional application of and claims benefit of U.S. Patent Application Ser. No. 62/868,012, filed Jun. 28, 2019, the entire disclosures of which are incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected IC devices per chip area) has generally increased while geometry size (i.e., dimensions and/or sizes of IC features and/or spacings between these IC features) has decreased. Typically, scaling down has been limited only by an ability to lithographically define IC features at the ever-decreasing geometry sizes. However, resistance-capacitance (RC) delay has arisen as a significant challenge as reduced geometry sizes are implemented to achieve ICs with faster operating speeds (e.g., by reducing distances traveled by electrical signals), thereby negating some of the advantages achieved by scaling down and limiting further scaling down of ICs. RC delay generally indicates delay in electrical signal speed through an IC resulting from a product of resistance (R) (i.e., a material's opposition to flow of electrical current) and capacitance (C) (i.e., a material's ability to store electrical charge). Reducing both resistance and capacitance is thus desired to reduce RC delay and optimize performance of scaled down ICs. Interconnects of ICs, which physically and/or electrically connect IC components and/or IC features of the ICs, are particularly problematic in their contributions to RC delay. A need thus exists for improvements in interconnects of ICs and/or methods of fabricating interconnects of ICs.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
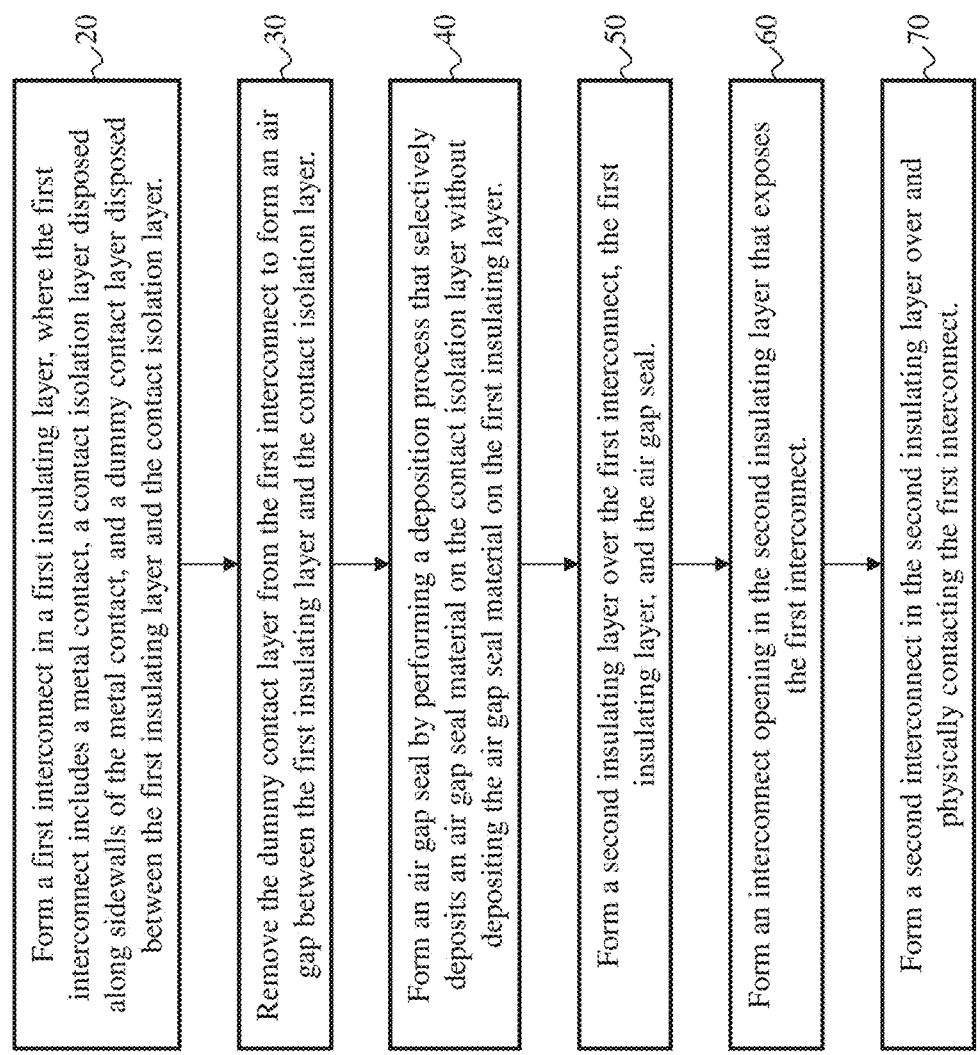
FIG. 1 is a flow chart of a method for fabricating an interconnect of an integrated circuit device according to various aspects of the present disclosure.

The present disclosure relates generally to integrated circuit devices, and more particularly, to interconnects for integrated circuit devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

IC manufacturing process flow is typically divided into three categories: front-end-of-line (FEOL), middle-end-of-line (MEOL), and back-end-of-line (BEOL). FEOL generally encompasses processes related to fabricating IC devices, such as transistors. For example, FEOL processes can include forming isolation features, gate structures, and source and drain features (generally referred to as source/drain features). MEOL generally encompasses processes related to fabricating contacts to conductive features (or conductive regions) of the IC devices, such as contacts (also referred to as interconnects) to the gate structures and/or the source/drain features. BEOL generally encompasses processes related to fabricating interconnects that physically and/or electrically interconnect IC features fabricated by FEOL processes (referred to herein as FEOL features or structures) and/or MEOL processes (referred to herein as MEOL features or structures), thereby enabling operation of the IC devices. For example, BEOL processes can include forming interconnects, such as vias and/or conductive lines, of a multilayer interconnect feature. The interconnects of MEOL processes and the BEOL processes physically and/or electrically connect IC components and/or IC features of the IC devices, thereby facilitating operation of the IC devices. As IC technologies progress towards smaller technology nodes, resistance and capacitance associated with interconnects have presented challenges to reducing resistance-capacitance (RC) delay of the IC devices.

Reducing resistance associated with interconnects has been achieved by implementing interconnect materials (for example, cobalt and/or ruthenium replacing copper and/or tantalum) and/or interconnect configurations (for example, reducing thicknesses of barrier/liner layers of the interconnects and/or modifying profiles of the interconnects) that exhibit decreased resistance and facilitate increased electrical current flow. Reducing capacitance is more difficult because, for any two adjacent conductive features (for example, two adjacent interconnects, an interconnect adjacent to a gate, etc.), capacitance is a function of a dielectric constant of insulating material surrounding the two conductive features and a distance between the two conductive features. Since decreased distances (spacing) between conductive features results from scaling down ICs (and thus results in increased capacitance), capacitance reduction techniques have focused on reducing the dielectric constant of the insulating material. For example, low-k dielectric materials, such as dielectric materials having dielectric constants less than silicon oxide (for example, $SiO_2$), have been developed that reduce parasitic capacitance and/or capacitive coupling between interconnects and adjacent conductive features, such as adjacent interconnects or adjacent device features (for example, gates).

Recently, air has been explored for insulating interconnects because air has a significantly lower dielectric constant than many low-k dielectric materials. For example, an air gap (also referred to as an air spacer) can be inserted between an interconnect and an adjacent conductive feature. Though the air gap provides desired capacitance reduction when compared to low-k dielectric materials, conventional air gap fabrication suffers from drawbacks. One such drawback is associated with subsequent processing. For example, where the air gap is inserted between a device-level contact (for example, a source/drain contact) and a gate, subsequent processing may involve depositing a dielectric seal layer (for example, an oxide layer) over the air gap and the device-level contact to seal the air gap, depositing an interlayer dielectric layer (often including a low-k dielectric material) over the dielectric seal layer, patterning and etching the interlayer dielectric layer and the dielectric seal layer to form a via opening, and filling the via opening with metal to form a via, such that the via is connected to the device-level contact. In one scenario, misalignment may occur during patterning that causes the etching to remove the dielectric seal layer over the air gap, exposing the air gap to the filling process. In another scenario, dimensions of the via may be intentionally larger than the device-level contact (for example, for an over-sized via), such that the patterning and etching required to achieve the via opening for the over-sized via exposes the air gap to the filling process. In yet another scenario, dimensions of the via may be unintentionally larger than the device-level contact as a result of processing variations, such that the patterning and etching required to achieve the via opening for the via unintentionally exposes the air gap to the filling process. Each of these scenarios may introduce metal into the air gap when filling the via opening to form the via, such that the metal contacts the air gap. This degrades capacitance reduction achieved by the air gap, impeding improvements in RC delay of corresponding IC devices. The present disclosure thus proposes an air gap seal and method of fabricating the air gap seal that overcomes these challenges and preserves air gap integrity, as described in detail herein.

FIG. 1 is a flow chart of a method 10 for fabricating an interconnect of an IC device according to various aspects of the present disclosure. The interconnect fabricated by method 10 can reduce capacitance and/or resistance associated with the IC device, thereby reducing associated RC delay. At block 20, method 10 includes forming a first interconnect in a first insulating layer. The first interconnect includes a metal contact, a contact isolation layer disposed along sidewalls of the metal contact, and a dummy contact layer disposed between the first insulating layer and the contact isolation layer. The dummy contact layer is disposed along the sidewalls of the metal contact. In some embodiments, the contact isolation layer is a silicon nitride layer, and the first insulating layer is a silicon oxide layer. At block 30, method 10 includes removing the dummy contact layer from the first interconnect to form an air gap between the first insulating layer and the contact isolation layer. In some embodiments, an etching process selectively removes the dummy contact layer but not does not remove, or substantially remove, the contact isolation layer and the first insulating layer. At block 40, method 10 includes forming an air gap seal by performing a deposition process that selectively deposits an air gap seal material on the contact isolation layer without depositing the air gap seal material on the first insulating layer. In some embodiments, the deposition process forms the air gap seal material on silicon nitride surfaces but not on silicon oxide surfaces. In some embodiments, the air gap seal material includes amorphous silicon.

At block 50, method 10 includes forming a second insulating layer over the first interconnect, the first insulating layer, and the air gap seal. At block 60, method 10 includes forming an interconnect opening in the second insulating layer that exposes the first interconnect. At block 70, method 10 includes forming a second interconnect in the second insulating layer over and physically contacting the first interconnect. In some embodiments, the first interconnect is a device-level contact, such as a gate contact or a source/drain contact, and the second interconnect is a via. In some embodiments, the first interconnect is a via and the second interconnect is a conductive line. In some embodiments, before forming the second interconnect, an oxidation process is performed on the air gap seal. In some embodiments, the air gap seal includes silicon oxide after the oxidation process. In some embodiments, the air gap seal includes amorphous silicon portions and silicon oxide portions after the oxidation process. Additional processing is contemplated by the present disclosure. Additional steps can be provided before, during, and after method 10, and some of the steps described can be moved, replaced, or eliminated for additional embodiments of method 10. The following discussion provides interconnects that can be fabricated according to method 10.

FIGS. 2-7 are fragmentary diagrammatic views of an integrated circuit (IC) device 200, in portion or entirety, at various stages of fabricating an interconnect of IC device 200 (such as those associated with method 100 in FIG. 1), according to various aspects of the present disclosure. IC device 200 may be included in a microprocessor, a memory, and/or other IC device. In some embodiments, IC device 200 may be a portion of an IC chip, a system on chip (SoC), or portion thereof, that includes various passive and active microelectronic devices such as resistors, capacitors, inductors, diodes, p-type FETs (PFETs), n-type FETs (NFETs), metal-oxide-semiconductor FETs (MOSFETs), complementary MOS (CMOS) transistors, bipolar junction transistors (BJTs), laterally diffused MOS (LDMOS) transistors, high voltage transistors, high frequency transistors, other suitable components, or combinations thereof. The various transistors may be planar transistors or multi-gate transistors, such as FinFETs, depending on design requirements of IC device 200. FIGS. 2-7 have been simplified for the sake of clarity to better understand the inventive concepts of the present disclosure. Additional features can be added in IC device 200, and some of the features described below can be replaced, modified, or eliminated in other embodiments of IC device 200.

Figure 2:
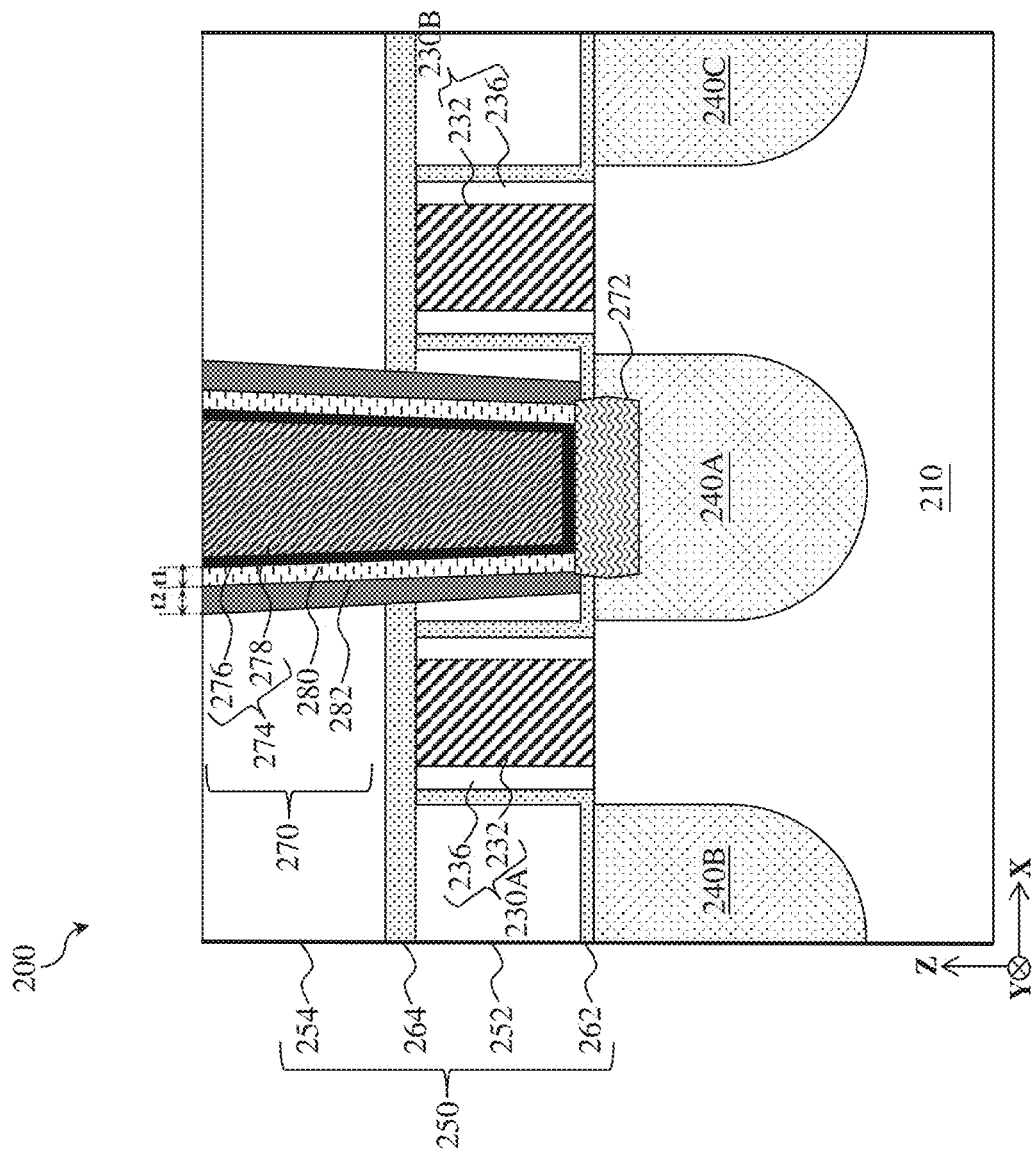
FIGS. 2-7 are fragmentary diagrammatic views of an integrated circuit device, in portion or entirety, at various stages of fabricating an interconnect, such as the method for fabricating an interconnect of an integrated circuit device of FIG. 1, according to various aspects of the present disclosure.

Turning to FIG. 2, IC device 200 includes a substrate (wafer) 210. In the depicted embodiment, substrate 210 includes silicon. Alternatively or additionally, substrate 210 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 210 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 210 can include doped regions formed by an ion implantation process, a diffusion process, and/or other suitable doping process depending on design requirements of IC device 200. In some embodiments, substrate 210 includes p-type doped regions (for example, p-type wells) doped with p-type dopants, such as boron, indium, other p-type dopant, or combinations thereof. In some embodiments, substrate 210 includes n-type doped regions (for example, n-type wells) doped with n-type dopants, such as phosphorus, arsenic, other n-type dopant, or combinations thereof. In some embodiments, substrate 210 includes doped regions formed with a combination of p-type dopants and n-type dopants. The various doped regions can be formed directly on and/or in substrate 210, for example, providing a p-well structure, an n-well structure, a dual-well structure, a raised structure, or combinations thereof.

Isolation features can be formed over and/or in substrate 210 to isolate various regions, such as device regions, of IC device 200. For example, isolation features define and electrically isolate active device regions and/or passive device regions from each other. Isolation features include silicon oxide, silicon nitride, silicon oxynitride, other suitable isolation material (for example, including silicon, oxygen, nitrogen, carbon, or other suitable isolation constituent), or combinations thereof. Isolation features can include different structures, such as shallow trench isolation (STI) structures, deep trench isolation (DTI) structures, and/or local oxidation of silicon (LOCOS) structures. In some embodiments, isolation features are formed by etching a trench (or trenches) in substrate 210 and filling the trench with insulator material (for example, using a chemical vapor deposition process or a spin-on glass process). A chemical mechanical polishing (CMP) process may be performed to remove excessive insulator material and/or planarize a top surface of isolation features. In some embodiments, isolation features can be formed by depositing an insulator material over substrate 210 after forming fin structures (in some embodiments, such that the insulator material layer fills gaps (trenches) between the fin structures) and etching back the insulator material layer. In some embodiments, isolation features include a multi-layer structure that fills trenches, such as a bulk dielectric layer disposed over a liner dielectric layer, where the bulk dielectric layer and the liner dielectric layer include materials depending on design requirements (for example, a bulk dielectric layer that includes silicon nitride disposed over a liner dielectric layer that includes thermal oxide). In some embodiments, isolation features include a dielectric layer disposed over a doped liner layer (including, for example, boron silicate glass (BSG) or phosphosilicate glass (PSG)).

Various gate structures are disposed over substrate 210, such as a gate structure 230A and a gate structure 230B. Gate structures 230A, 230B each engage a respective channel region defined between a respective source region and a respective drain region, such that current can flow between the respective source/drain regions during operation. In some embodiments, gate structures 230A, 230B are formed over a fin structure, such that gate structure 230A, 230B each wrap a portion of the fin structure and interpose a respective source region and a respective drain region (collectively referred to as source/drain regions) of the fin structure. Gate structures 230A, 230B each include a metal gate (MG) stack, such as a metal gate stack 232. Metal gate stacks 232 are formed by deposition processes, lithography processes, etching processes, other suitable processes, or combinations thereof. The deposition processes include CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plasma enhanced ALD (PEALD), plating, other suitable methods, or combinations thereof. The lithography patterning processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposure process is assisted, implemented, or replaced by other methods, such as maskless lithography, electron-beam writing, or ion-beam writing. The etching processes include dry etching processes, wet etching processes, other etching processes, or combinations thereof. Metal gate stacks 232 are fabricated according to a gate last process, a gate first process, or a hybrid gate last/gate first process. In gate last process embodiments, gate structures 230A, 230B include dummy gate stacks that are subsequently replaced with metal gate stacks 232. The dummy gate stacks include, for example, an interfacial layer (including, for example, silicon oxide) and a dummy gate electrode layer (including, for example, polysilicon). In such embodiments, the dummy gate electrode layer is removed, thereby forming openings (trenches) that are subsequently filled with metal gate stacks 232.

Metal gate stacks 232 are configured to achieve desired functionality according to design requirements of IC device 200, such that metal gate stack 232 of gate structure 230A may include the same or different layers and/or materials as metal gate stack 232 of gate structure 230B. In some embodiments, metal gate stacks 232 include a gate dielectric (for example, a gate dielectric layer) and a gate electrode (for example, a work function layer and a bulk conductive layer). Metal gate stacks 232 may include numerous other layers, for example, capping layers, interface layers, diffusion layers, barrier layers, hard mask layers, or combinations thereof. In some embodiments, the gate dielectric layer is disposed over an interfacial layer (including a dielectric material, such as silicon oxide), and the gate electrode is disposed over the gate dielectric layer. The gate dielectric layer includes a dielectric material, such as silicon oxide, high-k dielectric material, other suitable dielectric material, or combinations thereof. Examples of high-k dielectric material include hafnium dioxide ($HfO_2$), HfSiO, HfSiON, HfTaO, HfSiO, HfZrO, zirconium oxide, aluminum oxide, hafnium dioxide-alumina ($HfO_2$—$Al_2O_3$) alloy, other suitable high-k dielectric materials, or combinations thereof. High-k dielectric material generally refers to dielectric materials having a high dielectric constant (k value) relative to a dielectric constant of silicon dioxide (k≈3.9). For example, high-k dielectric material has a dielectric constant greater than about 3.9. In some embodiments, the gate dielectric layer is a high-k dielectric layer. The gate electrode includes a conductive material, such as polysilicon, aluminum (Al), copper (Cu), titanium (Ti), tantalum (Ta), tungsten (W), molybdenum (Mo), cobalt (Co), TaN, NiSi, CoSi, TiN, WN, TiAl, TiAlN, TaCN, TaC, TaSiN, other conductive material, or combinations thereof. In some embodiments, the work function layer is a conductive layer tuned to have a desired work function (such as an n-type work function or a p-type work function), and the conductive bulk layer is a conductive layer formed over the work function layer. In some embodiments, the work function layer includes n-type work function materials, such as Ti, silver (Ag), manganese (Mn), zirconium (Zr), TaAl, TaAlC, TiAlN, TaC, TaCN, TaSiN, other suitable n-type work function materials, or combinations thereof. In some embodiments, the work function layer includes a p-type work function material, such as ruthenium (Ru), Mo, Al, TiN, TaN, WN, $ZrSi_2$, $MoSi_2$, $TaSi_2$, $NiSi_2$, WN, other suitable p-type work function materials, or combinations thereof. The bulk (or fill) conductive layer includes a suitable conductive material, such as Al, W, and/or Cu. The bulk conductive layer may additionally or collectively include polysilicon, Ti, Ta, metal alloys, other suitable materials, or combinations thereof.

Gate structures 230A, 230B further include gate spacers 236, which are disposed adjacent to (for example, along sidewalls of) metal gate stacks 232. Gate spacers 236 are formed by any suitable process and include a dielectric material. The dielectric material can include silicon, oxygen, carbon, nitrogen, other suitable material, or combinations thereof (for example, silicon oxide, silicon nitride, silicon oxynitride, or silicon carbide). For example, in the depicted embodiment, a dielectric layer including silicon and nitrogen, such as a silicon nitride layer, can be deposited over substrate 210 and subsequently anisotropically etched to form gate spacers 236. In some embodiments, gate spacers 236 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to metal gate stacks 232. In such embodiments, the various sets of spacers can include materials having different etch rates. For example, a first dielectric layer including silicon and oxygen (for example, silicon oxide) can be deposited over substrate 210 and subsequently anisotropically etched to form a first spacer set adjacent to metal gate stacks 232 (or dummy metal gate stacks, in some embodiments), and a second dielectric layer including silicon and nitrogen (for example, silicon nitride) can be deposited over substrate 210 and subsequently anisotropically etched to form a second spacer set adjacent to the first spacer set. Implantation, diffusion, and/or annealing processes may be performed to form lightly doped source and drain (LDD) features and/or heavily doped source and drain (HDD) features in substrate 210 before and/or after forming gate spacers 236, depending on design requirements of IC device 200.

Epitaxial source features and epitaxial drain features (referred to as epitaxial source/drain features), such as an epitaxial source/drain feature 240A, an epitaxial source/drain feature 240B, and an epitaxial source/drain feature 240C, are disposed in source/drain regions of substrate 210. Gate structure 230A interposes epitaxial source/drain feature 240A and epitaxial source/drain feature 240B, such that a channel region is defined between epitaxial source/drain feature 240A and epitaxial source/drain feature 240B. Gate structure 230B interposes epitaxial source/drain feature 240A and epitaxial source/drain feature 240C, such that a channel region is defined between epitaxial source/drain feature 240A and epitaxial source/drain feature 240C. In some embodiments, gate structure 230A, epitaxial source/drain feature 240A, and epitaxial source/drain feature 240B form a portion of a first transistor of IC device 200, and gate structure 230B, epitaxial source/drain feature 240A, and epitaxial source/drain feature 240C form a portion of a second transistor of IC device 200. In some embodiments, a semiconductor material is epitaxially grown on and/or from substrate 210 to form epitaxial source/drain features 240A-240C over source/drain regions of substrate 210. In some embodiments, an etching process is performed on source/drain regions of substrate 210 to form source/drain recesses, where epitaxial source/drain features 240A-240C are grown to fill the source/drain recesses. In some embodiments, where substrate 210 represents a portion of a fin structure, epitaxial source/drain features 240A-240C wrap source/drain regions of the fin structure and/or are disposed in source/drain recesses of the fin structure depending on design requirements of IC device 200. An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of substrate 210. Epitaxial source/drain features 240A-240C are doped with n-type dopants and/or p-type dopants. In some embodiments, epitaxial source/drain features 240A-240C are epitaxial layers including silicon and/or carbon, where the silicon-comprising epitaxial layers or the silicon-carbon-comprising epitaxial layers are doped with phosphorous, other n-type dopant, or combinations thereof. In some embodiments, epitaxial source/drain features 240A-240C are epitaxial layers including silicon and germanium, where the silicon-and-germanium-compromising epitaxial layers are doped with boron, other p-type dopant, or combinations thereof. In some embodiments, epitaxial source/drain features 240A-240C include materials and/or dopants that achieve desired tensile stress and/or compressive stress in the channel regions. In some embodiments, epitaxial source/drain features 240A-240C are doped during deposition by adding impurities to a source material of the epitaxy process. In some embodiments, epitaxial source/drain features 240A-240C are doped by an ion implantation process subsequent to a deposition process. In some embodiments, annealing processes are performed to activate dopants in epitaxial source/drain features 240A-240C and/or other source/drain regions of IC device 200 (for example, HDD regions and/or LDD regions).

A multilayer interconnect (MLI) feature 250 is disposed over substrate 210. MLI feature 250 electrically couples various devices (for example, transistors, resistors, capacitors, and/or inductors) and/or components (for example, gate structures and/or source/drain features) of IC device 200, such that the various devices and/or components can operate as specified by design requirements of IC device 200. MLI feature 250 includes a combination of dielectric layers and conductive layers configured to form various interconnects.

The conductive layers are configured to form vertical interconnects, such as device-level contacts and/or vias, and/or horizontal interconnects, such as conductive lines. Vertical interconnects typically connect horizontal interconnects in different layers (or different planes) of MLI feature 250. In some embodiments, vertical interconnects and horizontal interconnects have respective lengths and widths measured along the same direction, where vertical interconnects have lengths greater than their widths, and horizontal interconnects have lengths less their widths. During operation of IC device 200, the interconnects are configured to route signals between the devices and/or the components of IC device 200 and/or distribute signals (for example, clock signals, voltage signals, and/or ground signals) to the devices and/or the components of IC device 200. It is noted that though MLI feature 250 is depicted with a given number of dielectric layers and conductive layers, the present disclosure contemplates MLI feature 250 having more or less dielectric layers and/or conductive layers depending on design requirements of IC device 200.

MLI feature 250 includes one or more insulating layers disposed over substrate 210, such as an interlayer dielectric (ILD) layer 252 (ILD-0), an interlayer dielectric (ILD) layer 254 (ILD-1), a contact etch stop layers (CESL) 262, and a contact etch stop layer (CESL) 264. ILD layer 252 is disposed over substrate 210, and ILD layer 254 is disposed over ILD layer 252. CESL 262 is disposed between ILD layer 252 and substrate 210, epitaxial source/drain features 240A-240C, and/or gate structures 230A, 230B (in particular, spacers 236). CESL 264 is disposed between ILD layer 252 and ILD layer 254. In some embodiments, a thickness of ILD layer 252 is about 5 nm to about 50 nm, a thickness of ILD layer 254 is about 2 nm to about 100 nm, a thickness of CESL 262 is about 1 nm to about 10 nm, and a thickness of CESL 264 is about 1 nm to about 10 nm. ILD layers 252, 254 and/or CESLs 262, 264 are formed over substrate 210 by a deposition process, such as CVD, PVD, ALD, HDPCVD, MOCVD, RPCVD, PECVD, LPCVD, ALCVD, APCVD, PEALD, other suitable methods, or combinations thereof. In some embodiments, ILD layers 252, 254 are formed by a flowable CVD (FCVD) process that includes, for example, depositing a flowable material (such as a liquid compound) over substrate 210 and converting the flowable material to a solid material by a suitable technique, such as thermal annealing and/or treating the flowable material with ultraviolet radiation. Subsequent to the deposition of ILD layers 252, 254 and/or CESLs 262, 264, a CMP process and/or other planarization process is performed, such that ILD layers 252, 254 and/or CESLs 262, 264 have substantially planar surfaces.

ILD layers 252, 254 include a dielectric material including, for example, silicon oxide, silicon nitride, silicon oxynitride, tetraethyl orthosilicate (TEOS) oxide, PSG, BPSG, low-k dielectric material, other suitable dielectric material, or combinations thereof. Low-k dielectric material generally refers to dielectric materials having a low dielectric constant relative to the dielectric constant of silicon dioxide (k≈3.9). For example, low-k dielectric material has a dielectric constant less than about 3.9. In some examples, low-k dielectric material has a dielectric constant less than about 2.5, which can be referred to as extreme low-k dielectric material. Exemplary low-k dielectric materials include fluorosilicate glass (FSG), carbon doped silicon oxide, Black Diamond® (Applied Materials of Santa Clara, California), Xerogel, Aerogel, amorphous fluorinated carbon, Parylene, BCB, SILK (Dow Chemical, Midland, Michigan), polyimide, other low-k dielectric material, or combinations thereof.

In the depicted embodiment, ILD layers 252, 254 include a low-k dielectric material and are generally referred to as low-k dielectric layers. CESLs 262, 264 include a material different than ILD layers 252, 254, such as a dielectric material that is different than the dielectric material of ILD layers 252, 254. ILD layers 252, 254 and/or CESLs 262, 264 can include a multilayer structure having multiple dielectric materials. In the depicted embodiment, where ILD layers 252, 254 include a silicon and oxygen (for example, SiCOH, $SiO_x$, or other silicon-and-oxygen comprising material) (and can thus be referred to as silicon oxide layers), CESLs 262, 264 include silicon and nitrogen and/or carbon (for example, SiN, SiCN, SiCON, SiON, SiC, and/or SiCO) (and can thus be referred to as silicon nitride layers).

MLI feature 250 further includes device-level contacts disposed in the insulating layers. Device-level contacts (also referred to as local interconnects or local contacts) electrically couple and/or physically couple IC device features to other conductive features of MLI feature 250 (for example, vias). Device-level contacts (also referred to as local interconnects or local contacts) include metal-to-poly (MP) contacts, which generally refer to contacts to a gate structure, such as a poly gate structure or a metal gate structure, and metal-to-device (MD) contacts, which generally refer to contacts to a conductive region of IC device 200, such as source/drain regions. In FIG. 2, MLI feature 250 is depicted with an MD contact, such as an interconnect 270 disposed on epitaxial source/drain feature 240A. Interconnect 270 includes a silicide layer 272, a source/drain contact 274 (including, for example, a contact barrier layer 276 and a contact bulk layer 278), a contact isolation layer 280, and a dummy contact layer 282. Interconnect 270 extends through ILD layer 254, CESL 264, ILD layer 252, and CESL 262 to epitaxial source/drain feature 240A. In some embodiments, interconnect 270 extends partially into epitaxial source/drain feature 240A, such as depicted. In some embodiments, interconnect 270 is an MEOL conductive feature that electrically and/or physically couples an FEOL conductive feature (for example, epitaxial source/drain feature 240A) to a BEOL conductive feature (for example, a via). The present disclosure contemplates embodiments where interconnect 270 extends through more or less ILD layers and/or CESLs of MLI feature 250 and embodiments where interconnect 270 includes more or less layers depending on design requirements of interconnect 270 and/or IC device 200.

Silicide layer 272 is disposed on epitaxial source/drain feature 240A. Silicide layer 272 extends through CESL 262. In the depicted embodiment, a top surface of silicide layer 272 is disposed higher than a top surface of CESL 262 relative to a top surface of substrate 210. In some embodiments, the top surface of silicide layer 272 is disposed lower and/or substantially planar with the top surface of CESL 262 relative to the top surface of substrate 210. In some embodiments, the top surface of silicide layer 272 is disposed lower than the top surface of substrate 210. Silicide layer 272 may be formed by depositing a metal layer over epitaxial source/drain feature 240A and heating IC device 200 (for example, subjecting IC device 200 to an annealing process) to cause constituents of epitaxial source/drain feature 240A (for example, silicon and/or germanium) to react with metal constituents of the metal layer. The metal layer includes any metal constituent suitable for promoting silicide formation, such as nickel, platinum, palladium, vanadium, titanium, cobalt, tantalum, ytterbium, zirconium, other suitable metal, or combinations thereof. Silicide layer 272 thus includes a metal constituent and a constituent of epitaxial source/drain feature 240A, such as silicon and/or germanium. For example, silicide layer 272 includes nickel silicide, titanium silicide, or cobalt silicide. Any un-reacted metal, such as remaining portions of the metal layer, may be selectively removed relative to silicide layer 272 and/or a dielectric material, for example, by a etching process.

Source/drain contact 274 extends through ILD 254, CESL 264, and ILD 252 to silicide layer 272, such that source/drain contact 274 is disposed on silicide layer 272. In the depicted embodiment, a bottom surface of source/drain contact 274 is disposed higher than the top surface of CESL 262 relative to the top surface of substrate 210. In some embodiments, the bottom surface of source/drain contact 274 is disposed lower and/or substantially planar with the top surface of CESL 262 relative to the top surface of substrate 210. In some embodiments, the bottom surface of source/drain contact 274 is disposed lower than the top surface of substrate 210. Contact barrier layer 276 includes a material that promotes adhesion between a dielectric material (here, contact isolation layer 280) and contact bulk layer 278. For example, contact barrier layer 276 includes titanium, titanium alloy, tantalum, tantalum alloy, cobalt, cobalt alloy, ruthenium, ruthenium alloy, molybdenum, molybdenum alloy, other suitable constituent configured to promote and/or enhance adhesion between a metal material and a dielectric material, or combinations thereof. In some embodiments, contact barrier layer 276 includes tantalum and nitrogen (for example, tantalum nitride) or titanium and nitrogen (for example, titanium nitride). In some embodiments, contact barrier layer 276 includes multiple layers. For example, contact barrier layer 276 may include a first sub-layer that includes titanium and a second sub-layer that includes titanium nitride. In another example, contact barrier layer 276 may include a first sub-layer that includes tantalum and a second sub-layer that includes tantalum nitride. Contact bulk layer 278 includes tungsten, ruthenium, cobalt, copper, aluminum, iridium, palladium, platinum, nickel, low resistivity metal constituent, alloys thereof, or combinations thereof. In the depicted embodiment, contact bulk layer 278 includes tungsten or cobalt. In some embodiments, source/drain contact 274 does not include contact barrier layer 276, such that contact bulk layer 278 physically contacts contact isolation layer 280. In some embodiments, source/drain contact 274 is partially barrier-free, where contact barrier layer 276 is disposed between contact isolation layer 280 and a portion of contact bulk layer 278. In some embodiments, contact bulk layer 278 includes multiple layers.

Contact isolation layer 280 surrounds source/drain contact 274. For example, contact isolation layer 280 is disposed along and on sidewalls of source/drain contact 274. Contact isolation layer 280 extends through ILD 254, CESL 264, and ILD 252 to silicide layer 272, such that contact isolation layer 280 is disposed on a top surface of silicide layer 272. In some embodiments, depending on design requirements of interconnect 270, contact isolation layer extends to CESL 262, such that contact isolation layer 280 is disposed on the top surface of CESL 262. In the depicted embodiment, contact isolation layer 280 has a substantially uniform thickness along sidewalls of source/drain contact 274 and extends along an entirety of sidewalls of source/drain contact 274. However, the present disclosure contemplates embodiments where a thickness of contact isolation layer 280 varies (for example, tapers) along sidewalls of source/drain contact 274 and/or where contact isolation layer 280 extends along a portion of sidewalls of source/drain contact 274. In some embodiments, a thickness t1 of contact isolation layer 280 defined along the x-direction is about 0.5 nm to about 5 nm. In the depicted embodiment, contact isolation layer 280 is a nitrogen-comprising layer. For example, contact isolation layer 280 includes silicon and nitrogen and optionally carbon, such as SiN, SiCN, carbon-doped SiN, high-density SiN, low-density SiN, other silicon-and-nitrogen-comprising material, or combinations thereof. In some embodiments, contact isolation layer 280 is a high-density SiN layer, while dummy contact layer 282 includes a material that facilitates etching selectivity between contact isolation layer 280 and dummy contact layer 282 during subsequent processing, such as silicon, germanium, silicon germanium, polysilicon, amorphous silicon, BSG, PSG, doped silicon (e.g., in-situ doped silicon), other suitable material, or combinations thereof. In some embodiments, a composition of contact isolation layer 280 is the same as a composition of CESLs 262, 264.

Dummy contact layer 282 surrounds source/drain contact 274. For example, dummy contact layer 282 is disposed along sidewalls of source/drain contact 274 between contact isolation layer 280 and insulating layers of MLI feature 250 (here, ILD layers 252, 254 and CESL 264). Dummy contact layer 282 is separated from sidewalls of source/drain contact 274 by contact isolation layer 280. Dummy contact layer 282 extends through ILD 254, CESL 264, and ILD 252 to CESL 262, such that dummy contact layer 282 is disposed on the top surface of CESL 262. In the depicted embodiment, dummy contact layer 282 has a substantially uniform thickness along sidewalls of source/drain contact 274. However, the present disclosure contemplates embodiments where a thickness of dummy contact layer 282 varies (for example, tapers) along sidewalls of source/drain contact 274 and/or where dummy contact layer 282 extends along a portion of sidewalls of source/drain contact 274. In some embodiments, a thickness t2 of dummy contact layer 282 defined along the x-direction is about 0.5 nm to about 5 nm. In some embodiments, thickness t2 and a length of dummy contact layer 282 along sidewalls of source/drain contact 274 are tailored to control dimensions of an air gap of interconnect 270. A composition of dummy contact layer 282 is different than compositions of layers surrounding dummy contact layer 282 (for example, ILD layers 252, 254, CESLs 262, 264, and/or contact isolation layer 280) to achieve etching selectivity during subsequent etching processes, such as those used to form the air gap of interconnect 270. In other words, dummy contact layer 282 and its surrounding layers include materials having distinct etching sensitivities to a given etchant. For example, dummy contact layer 282 includes a material having an etch rate to an etchant that is greater than an etch rate of materials of ILD layers 252, 254, CESLs 262, 264, and/or contact isolation layer 280 to the etchant. In some embodiments, materials of dummy contact layer 282 and its surrounding layers are tailored to achieve an etch selectivity (i.e., a ratio of an etch rate of dummy contact layer 282 to an etch rate of its surrounding layers) of about 10:1 to about 1,000:1. Dummy contact layer 282 includes silicon, germanium, oxygen, nitrogen, carbon, other suitable constituent, or combinations thereof. In the depicted embodiment, dummy contact layer 282 is a polysilicon layer. In some embodiments, dummy contact layer 282 is a silicon layer, a germanium layer, or a silicon germanium layer, which in some embodiments, is doped with a suitable dopant to achieve desired etching selectivity. In some embodiments, dummy contact layer 282 is an amorphous silicon layer. In some embodiments, dummy contact layer 282 is a BSG layer or a PSG layer. In some embodiments, dummy contact layer 282 is a low-density silicon nitride layer, for example, relative to contact isolation layer 280 and/or CESLs 262, 264, one or more of which may be configured as a high-density silicon nitride layer. In some embodiments, dummy contact layer 282 is a low-density silicon oxide layer, for example, relative to ILD layers 252, 254, one or more of which may be configured as a high-density silicon oxide layer. Degrees of density to achieve "high-density" and "low-density" can be configured to achieve desired etching selectivity for subsequent etch processes.

Figure 3:
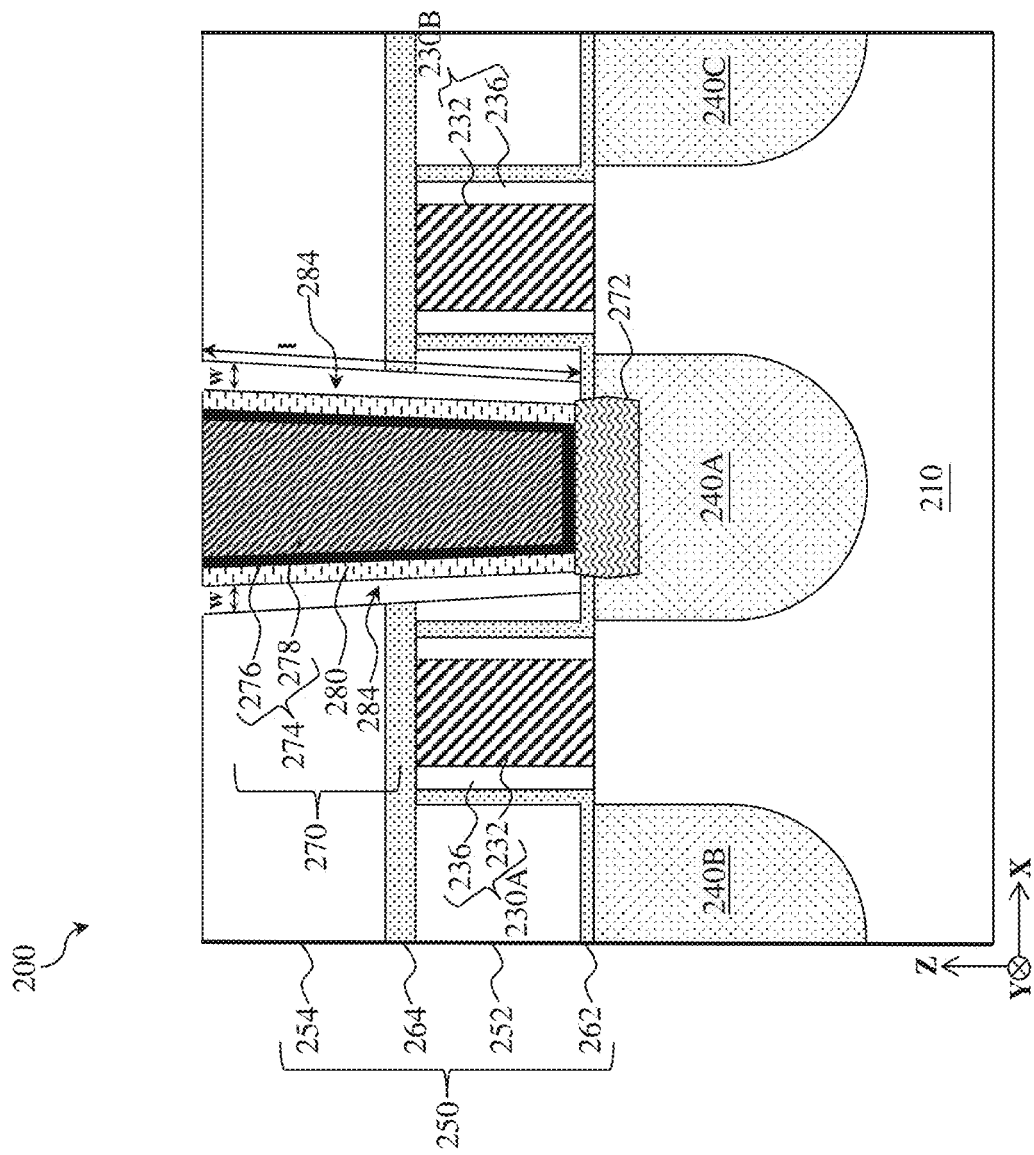

Turning to FIG. 3, dummy contact layer 282 is selectively removed by an etch process to form an air gap 284 of interconnect 270. Air gap 284 is defined between contact isolation layer 280 and insulating layers of MLI feature 250 (here, ILD layer 254, CESL 264, and ILD layer 252). In the depicted embodiment, air gap 284 is a high aspect ratio trench having a bottom defined by the top surface of CESL 262 and sidewalls defined by contact isolation layer 280 and insulating layers of MLI feature 250. In some embodiments, the bottom and/or the sidewalls of the high aspect ratio trench are further defined by silicide layer 272. Accordingly, air gap 284 is disposed along sidewalls of source/drain contact 274 and extends through ILD layer 254, CESL 264, and ILD layer 252 to CESL 262, such that air gap 284 surrounds source/drain contact 274. High aspect ratio trench generally refers to a trench having one dimension that is substantially greater than another dimension. For example, air gap 284 has a length 1 (defined along a length-wise direction of source/drain contact 274 (for example, along the z-direction)) and a width w (defined along a width-wise direction of source/drain contact 274 (for example, along the x-direction)), where length 1 is substantially greater than width w. In some embodiments, a ratio of length 1 to width w is greater than about 10. In some embodiments, length 1 is about 10 nm to about 160 nm. In some embodiments, width w is about 0.5 nm to about 5 nm. In the depicted embodiment, width w is substantially the same as thickness t2 of removed dummy contact layer 282.

The etch process is configured to selectively remove dummy contact layer 282 with respect to ILD layers 252, 254, CESLs 262, 264, and/or contact isolation layer 280. In other words, the etch process substantially removes dummy contact layer 282 but does not remove, or does not substantially remove, ILD layers 252, 254, CESLs 262, 264, and/or contact isolation layer 280. Various etch parameters can be tuned to achieve selective etching of dummy contact layer 282, such as etchant composition, etch temperature, etch solution concentration, etch time, etch pressure, source power, radio frequency (RF) bias voltage, RF bias power, etchant flow rate, other suitable etch parameters, or combinations thereof. For example, an etchant is selected for the etching process that etches the material of dummy contact layer 282 (in the depicted embodiment, polysilicon) at a higher rate than the material of contact isolation layer 280, CESLs 264, 262, and ILD layers 252, 254 (in the depicted embodiment, silicon nitride and silicon oxide) (i.e., the etchant has a high etch selectivity with respect to the material of dummy contact layer 282). The etch process is a dry etching process, a wet etching process, other suitable etching process, or combinations thereof. A dry etching process may implement a hydrogen-comprising etch gas, an oxygen-comprising etch gas, a fluorine-comprising etch gas (for example, $CF_4$, $SF_6$, $CH_2F_2$, $CHF_3$, and/or $C_2F_6$), a chlorine-comprising etch gas (for example, $Cl_2$, $CHCl_3$, $CCl_4$, and/or $BCl_3$), a bromine-comprising etch gas (for example, HBr and/or $CHBr_3$), an iodine-comprising etch gas, other suitable etch gases and/or etch plasmas, or combinations thereof. A wet etching process may implement a wet etchant solution that includes diluted hydrofluoric acid (DHF), potassium hydroxide (KOH), ammonium hydroxide ($NH_4OH$), ammonia ($NH_3$), hydrofluoric acid (HF), nitric acid ($HNO_3$), acetic acid ($CH_3COOH$), water ($H_2O$), other suitable wet etchant solution constituents, or combinations thereof. In some embodiments, the etch process is a multi-step etch process.

Because air has a dielectric constant that is about one ($k \approx 1$), which is lower than dielectric constants of insulating materials conventionally implemented in MLI feature 250 (for example, silicon oxide or silicon nitride), air gap 284 reduces a capacitance between gate structure 230A and source/drain contact 274 and a capacitance between gate structure 230B and source/drain contact 274. As a result, parasitic capacitance and associated RC delay of IC device 200 is greatly reduced by surrounding source/drain contact 274 with air gap 284. Further, because air gap 284 separates source/drain contact 274 from ILD layers 252, 254 and CESLs 262, 264, such that source/drain contact 274 does not physically contact ILD layers 252, 254 and CESLs 262, 264, air gap 284 minimizes (and, in some embodiments, eliminates) metal diffusion from source/drain contact 274 into ILD layers 252, 254 and CESLs 262, 264. Source/drain contact 274 can thus be configured without a barrier layer, in some embodiments, which can ease manufacturing requirements and/or reduce resistance associated with interconnect 270. It has been observed that, sometimes, during subsequent processing, conductive material can enter into air gap 284, negating the foregoing advantages. The present disclosure thus proposes air gap sealing techniques below that preserve integrity of air gap 284, so that IC device 200 can maintain reduced capacitance and/or resistance characteristics provided by air gap 284.

Figure 4:
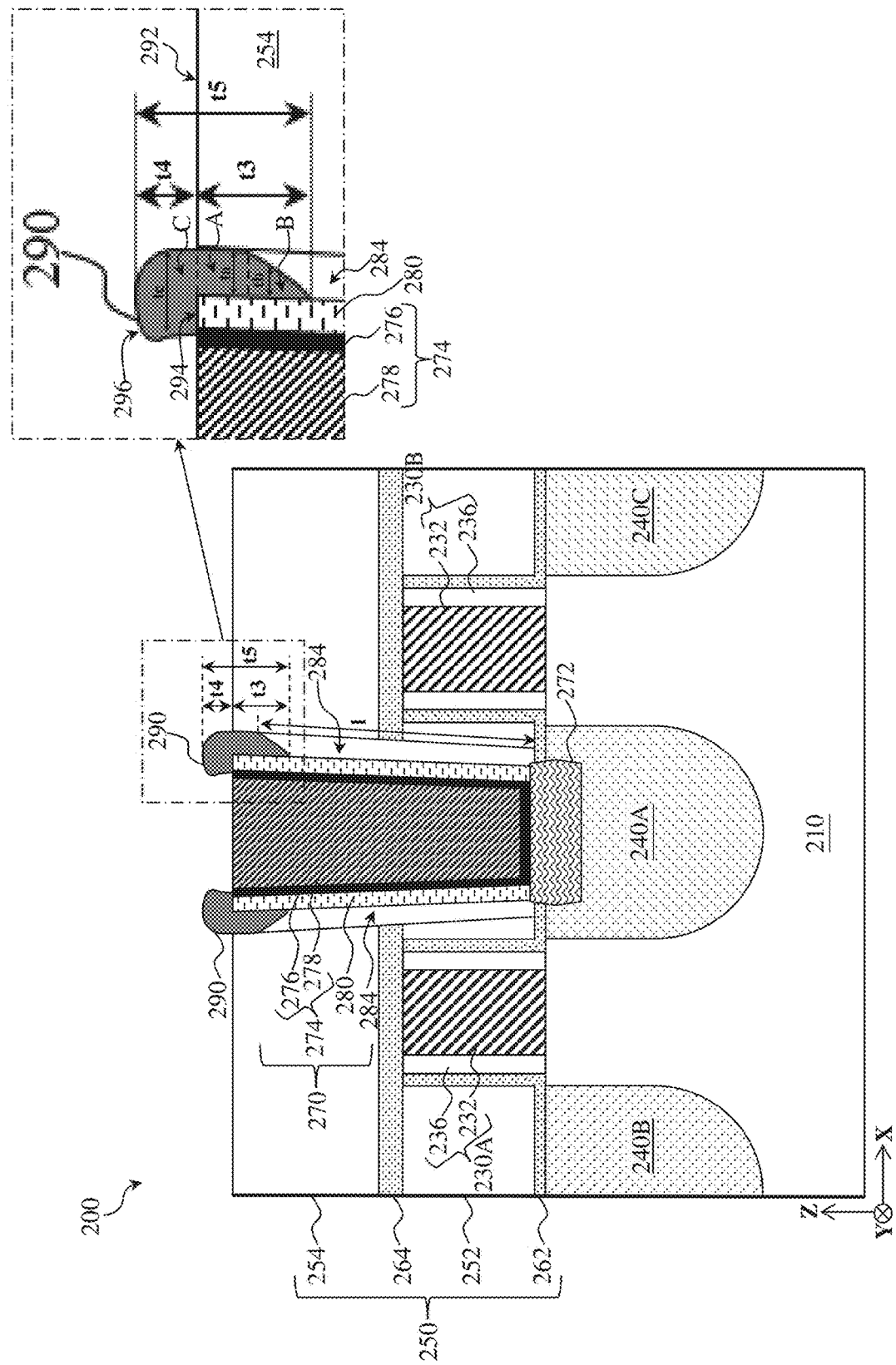

Turning to FIG. 4, a selective deposition process is performed to form an air gap seal 290 that seals (closes) air gap 284. Air gap seal 290 fills a topmost portion of air gap 284, such that materials formed over interconnect 270 during subsequent processing (for example, materials from insulating layers and/or conductive layers of MLI feature 250) do not seep or enter into air gap 284 and degrade or alter the capacitance and/or resistance reduction characteristics of IC device 200 provided by air gap 284. In FIG. 4, air gap seal 290 defines a top of air gap 284 and reduces length 1 of air gap 284, such that air gap 284 is disposed along a portion, instead of the entirety, of sidewalls of source/drain contact 274. A composition of air gap seal 290 is different than compositions of insulating layers of MLI feature (for example, ILD layers and/or CESLs) to achieve etching selectivity during subsequent etch processes, such as those used to form a via of MLI feature 250 over interconnect 270. In other words, air gap seal 290 and its surrounding layers include materials having distinct etching sensitivities to a given etchant. For example, air gap seal 290 includes a material having an etch rate to an etchant that is less than an etch rate of materials of ILD layers and/or CESLs of MLI feature 250 to the etchant. In some embodiments, materials of air gap seal 290 and its surrounding layers (a CESL and an ILD layer subsequently formed over air gap seal 290 and ILD layer 254) are tailored to achieve an etch selectivity (i.e., a ratio of an etch rate of air gap seal 290 to an etch rate of its surrounding layers) of about 1:10 to about 1:1,000. Air gap seal 290 further includes a material that can be selectively deposited on contact isolation layer 280 with respect to ILD layer 254. In the depicted embodiment, air gap seal 290 includes amorphous silicon (a-Si), which generally refers to silicon in non-crystalline form (i.e., having a disordered atomic structure). The present disclosure contemplates air gap seal 290 including other materials that can achieve both the selective deposition characteristics and the selective etch characteristics disclosed herein.

The deposition process is configured to selectively grow an air gap seal material (for example, amorphous silicon) on contact isolation layer 280 with respect to ILD layer 254. In other words, the air gap seal material grows on contact isolation layer 280 but does not grow, or does not substantially grow, on ILD layer 254. Preventing (or minimizing) growth of the air gap seal material on ILD layer 254 (and ILD 252) ensures that the air gap seal material will not fill air gap 284, such that air gap 284 is maintained surrounding source/drain contact 274. In the depicted embodiment, where ILD layer 254 is an oxide layer and contact isolation layer 280 is a silicon nitride layer, the deposition process is configured to selectively grow amorphous silicon on silicon nitride surfaces but not, or not substantially, on oxide surfaces. For example, since ILD layer 254 and contact isolation layer 280 have different bonding surfaces (in some embodiments, ILD layer 254 has dangling —OH bonds while contact isolation layer 280 has dangling —NH bonds), the deposition process exposes surfaces of contact isolation layer 280 and ILD layer 254 to a silicon-comprising precursor gas that can nucleate and grow more quickly on silicon nitride surfaces (i.e., contact isolation layer 280) than oxide surfaces (i.e., ILD layer 254). The deposition process is CVD, ALD, PECVD, PEALD, LPCVD, other suitable process, or combinations thereof. In some embodiments, the silicon-comprising precursor gas includes silane ($SiH_4$), which can nucleate and grow on both silicon nitride surfaces and oxide surfaces but will nucleate and grow more quickly on silicon nitride surfaces. In some embodiments, the silicon-comprising precursor gas includes silane ($SiH_4$), disilane ($Si_2H_6$), trisilane ($Si_3H_8$), tetrasilane ($Si_4H_{10}$), dichlorosilane (DCS), other silicon-comprising precursor gas, or combinations thereof. In some embodiments, the deposition process further exposes surfaces of contact isolation layer 280 and ILD layer 254 to an etching gas that can enhance selective growth of the air gap seal material on silicon nitride surfaces. For example, the etching gas may remove poorly nucleated air gap seal material on silicon oxide surfaces more quickly than well nucleated air gap seal material on silicon nitride surfaces. In some embodiments, the etching gas includes a hydrogen-comprising etch gas (for example, $H_2$ and/or $NH_3$), a fluorine-comprising etch gas (for example, HF, $F_2$, $NF_3$, $CF_4$, $SF_6$, $CH_2F_2$, $CHF_3$, and/or $C_2F_6$), a chlorine-comprising etch gas (e.g., $Cl_2$, $CHCl_3$, $CCl_4$, and/or $BCl_3$), an oxygen-comprising etch gas (for example, O2), a bromine-comprising etch gas (e.g., HBr and/or $CHBr_3$), an iodine-comprising etch gas, other suitable etch gases and/or etch plasmas, or combinations thereof. In some embodiments, the deposition process can use a carrier gas for delivering the silicon-comprising precursor gas, the etching gas, and/or other gas. In some embodiments, the carrier gas includes nitrogen ($N_2$), argon (Ar), helium (He), xenon (Xe), other suitable carrier gas constituent, or combinations thereof. The deposition process can involve supplying the silicon-comprising precursor gas and the etching gas to the surfaces of IC device 200 simultaneously and/or sequentially (for example, cyclically supplying the silicon-comprising precursor gas and the etching gas).

Various parameters of the deposition process can be tuned to achieve desired growth characteristics of the air gap seal material, such as a flow rate of a deposition gas (including the silicon-comprising precursor gas, the carrier gas, and/or the etching gas), a concentration (or dosage) of the silicon-comprising precursor gas, a concentration (or dosage) of the carrier gas, a concentration (or dosage) of the etching gas, a ratio of the concentration of the silicon-comprising precursor gas to the concentration of the carrier gas, a ratio of the concentration of the silicon-comprising precursor gas to the concentration of the etching gas, a ratio of the concentration of the carrier gas to the concentration of the etching gas, a power of a radiofrequency (RF) source (for example, used during the deposition process to generate a plasma), a bias voltage (for example, applied during the deposition process to excite the plasma), a pressure (for example, of a chamber in which the deposition process is performed on IC device 200), a duration of the deposition process, other suitable deposition parameters, or combinations thereof. For example, a duration of the deposition process, a flow rate of the deposition gas, a temperature of the deposition process, and a pressure of the deposition process are tailored to ensure that the air gap seal material grows (deposits) more quickly on silicon nitride surfaces (i.e., contact isolation layer 280) than oxide surfaces (i.e., ILD layer 254). In some embodiments, the duration of the deposition process is about 1 minute to about 30 minutes. In some embodiments, a flow rate of the deposition gas is about 10 sccm (standard cubic centimeters) to about 20,000 sccm. In some embodiments, the deposition process implements a ratio of a flow rate of a precursor gas to a flow rate of a carrier gas of about 0.001 to about 0.5. In some embodiments, the deposition process is performed at a pressure of about 0.01 Torr to about 100 Torr. In some embodiments, the deposition process is a low temperature deposition process, for example, performed at a temperature less than about 700° C. In some embodiments, the temperature is about room temperature (for example, about 20° C. to about 25° C.) to about 700° C. In some embodiments, the various parameters of the deposition process are configured to achieved a deposition rate of air gap seal material on silicon nitride surfaces that is greater than an etch rate of air gap seal material on silicon nitride surfaces and a deposition rate of the air gap seal material on silicon oxide surfaces that is the same as an etch rate of air gap seal material on silicon oxide surfaces, such that the air gap seal material (for example, amorphous silicon) is deposited on silicon nitride surfaces (for example, contact isolation layer 280) but not deposited on silicon oxide surfaces (for example, ILD layer 254).

The deposition process is performed until air gap seal 290 fills a top portion of air gap 284 and extends above a top surface 292 of ILD layer 254. In the depicted embodiment, air gap seal 290 has three portions—segment A having a thickness to defined along the x-direction, segment B having a thickness tb defined along the x-direction, and segment C having a thickness tc defined along the x-direction. Segment A and segment B combine to form a portion of air gap seal 290 having a thickness t3 defined along the z-direction that is disposed below top surface 292 of ILD layer 254, and segment C is a portion of air gap seal 290 having a thickness t4 defined along the z-direction that is disposed above top surface 292 of ILD layer 254. Such configuration results because the deposition process can be tuned to selectively deposit the air gap seal material on contact isolation layer 280 and because air gap 284 is a high aspect ratio trench. For example, during the deposition process, the deposition gas will contact surfaces of contact isolation layer 280 defining the top portion of air gap 284 more quickly than surfaces of contact isolation layer 280 defining a bottom portion of air gap 284. Air gap seal material may thus grow from surfaces of contact isolation layer 280 in a manner that fills the top portion of air gap 284 before the air gap seal material can nucleate and grow on surfaces of contact isolation layer 280 defining the bottom portion of air gap 284. In some embodiments, air gap seal 290 is formed before the deposition gas is able to reach surfaces of contact isolation layer 280 defining the bottom portion of air gap 284. In some embodiments, thickness t3 is about 1 nm to about 5 nm, and thickness t4 is about 0.5 nm to about 5 nm. In some embodiments, a total thickness t5 of air gap seal 290 along the z-direction is about 1.5 nm to about 10 nm.

Segment A, having a substantially uniform thickness, completely fills a topmost portion of air gap 284 defined between contact isolation layer 280 and ILD layer 254. For example, thickness ta is substantially the same as width w of air gap 284 along sidewalls of source/drain contact 274, such as about 0.5 nm to about 5 nm. Segment B, having a tapered thickness, partially fills a portion of air gap 284 defined between contact isolation layer 280 and ILD layer 254. For example, thickness tb tapers along sidewalls of source/drain contact 274 from a thickness that is substantially the same as width w of air gap 284 to a thickness that is less than width w of air gap 284. For example, thickness tb decreases from a first thickness proximate to a second thickness that is less than the first thickness. In some embodiments, thickness tb decreases from about 0.5 nm to about 5 nm to zero along sidewalls of source/drain contact 274 towards a top surface of substrate 210. Segment C, having a thickness that is greater than width w of air gap 284, is disposed on a top surface 294 of contact isolation layer 280 but not on top surface 292 of ILD 254. For example, thickness tc is greater than ta. In the depicted embodiment, segment C covers an entirety of top surface 294 of contact isolation layer 280, though the present disclosure contemplates embodiments where segment C covers a portion of top surface 294 of contact isolation layer 280. In some embodiments, segment C grows laterally to cover a portion of a top surface of source/drain contact 274, such as a portion or entirety of a top surface of barrier layer 276 of source/drain contact 274. In some embodiments, thickness tc is substantially the same as width w of air gap 284, such that segment C is not disposed on top surface 294 of contact isolation layer 280 or top surface 292 of ILD layer 254. Further, because air gap seal material of segment C is not confined between contact isolation layer 280 and ILD layer 254, a top surface 296 of air gap seal 290 may be curvilinear, in some embodiments.

Figure 5:
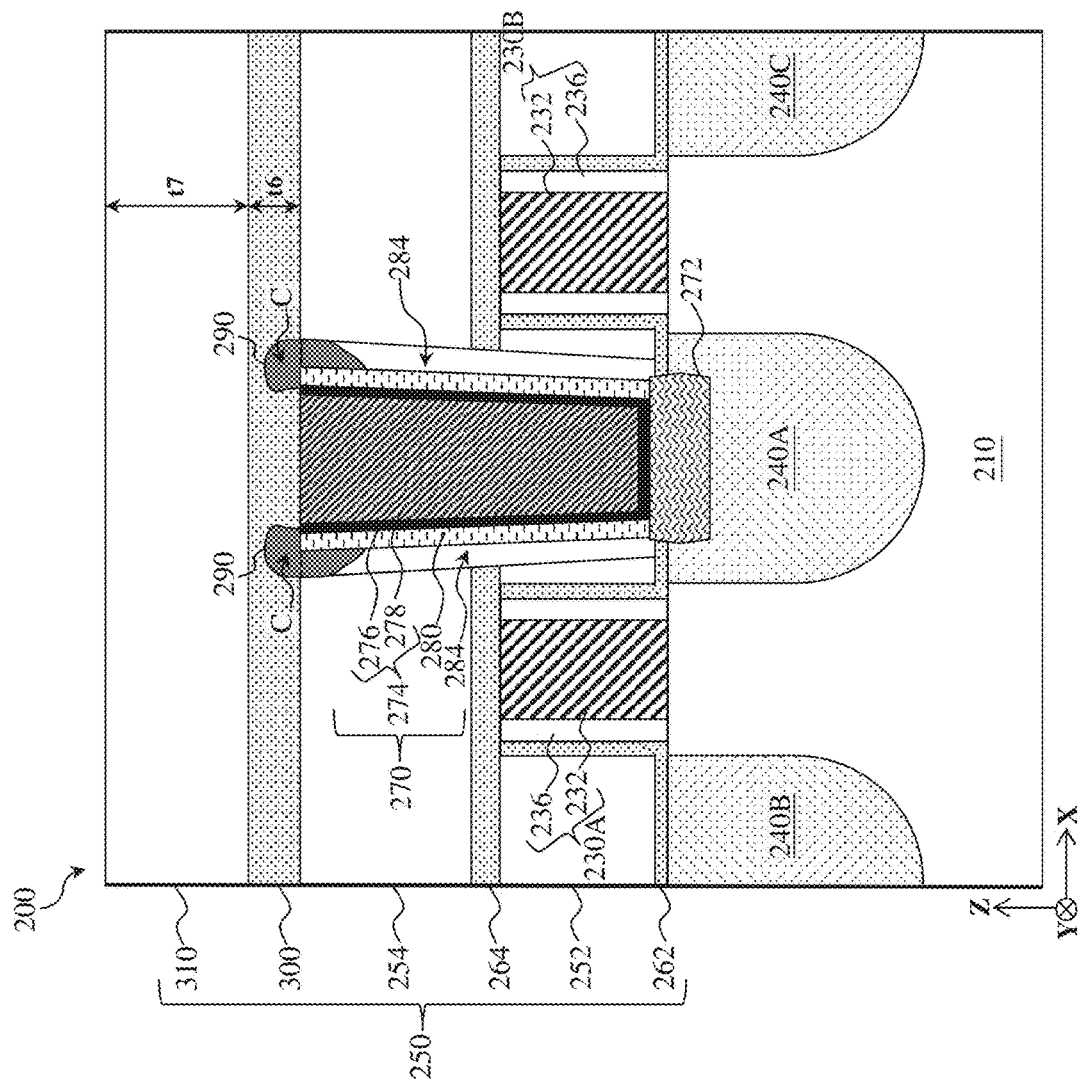

Turning to FIG. 5, an insulating layer of MLI feature 250 is formed over air gap seal 290, interconnect 270, and ILD layer 254. For example, a CESL 300 is deposited over air gap seal 290, interconnect 270, and ILD layer 254, and an ILD layer 310 is deposited over CESL 300. A thickness t6 of CESL 300 defined along the z-direction is greater than thickness t4 of segment C of air gap seal 290, such that CESL 300 is disposed over and covers top surface 296 of air gap seal 290. In some embodiments, thickness t6 is about 1 nm to about 10 nm. In some embodiments, a thickness t7 of ILD layer 310 defined along the z-direction is about 2 nm to about 50 nm. CESL 300 and ILD layer 310 include different compositions and/or materials to achieve etching selectivity. For example, CESL 300 includes a dielectric material that is different than a dielectric material of ILD layer 310. In some embodiments, CESL 300 includes silicon and nitrogen and/or carbon (for example, SiN, SiCN, SiCON, SiON, SiC, and/or SiCO). In some embodiments, CESL 300 includes a metal oxide, such as AlOx, AlZrOx, ZrOx, other suitable metal oxide, or combinations thereof. In addition to providing an etch stop, CESL 300 may also improve etching uniformity. In some embodiments, ILD layer 310 includes silicon oxide, silicon nitride, silicon oxynitride, TEOS-formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, California), Xerogel, Aerogel, amorphous fluorinated carbon, Parylene, BCB, SILK (Dow Chemical, Midland, Michigan), polyimide, other low-k dielectric material, or combinations thereof. CESL 300 and/or ILD layer 310 can include a multilayer structure having multiple dielectric materials. In the depicted embodiment, CESL 300 includes silicon and nitrogen (and is thus referred to as a silicon nitride layer) and ILD layer 310 includes silicon and oxygen, such as SiCOH, $SiO_x$, or other silicon-and-oxygen comprising material (and is thus referred to as a silicon oxide layer). CESL 300 and ILD layer 310 are formed by a deposition process, such as CVD, PVD, ALD, HDPCVD, MOCVD, RPCVD, PECVD, LPCVD, ALCVD, APCVD, FCVD, PEALD, other suitable methods, or combinations thereof. Subsequent to the deposition of CESL 300 and/or ILD layer 310, a CMP process and/or other planarization process is performed, such that CESL 300 and/or ILD layer 310 have substantially planar surfaces.

Figure 6:
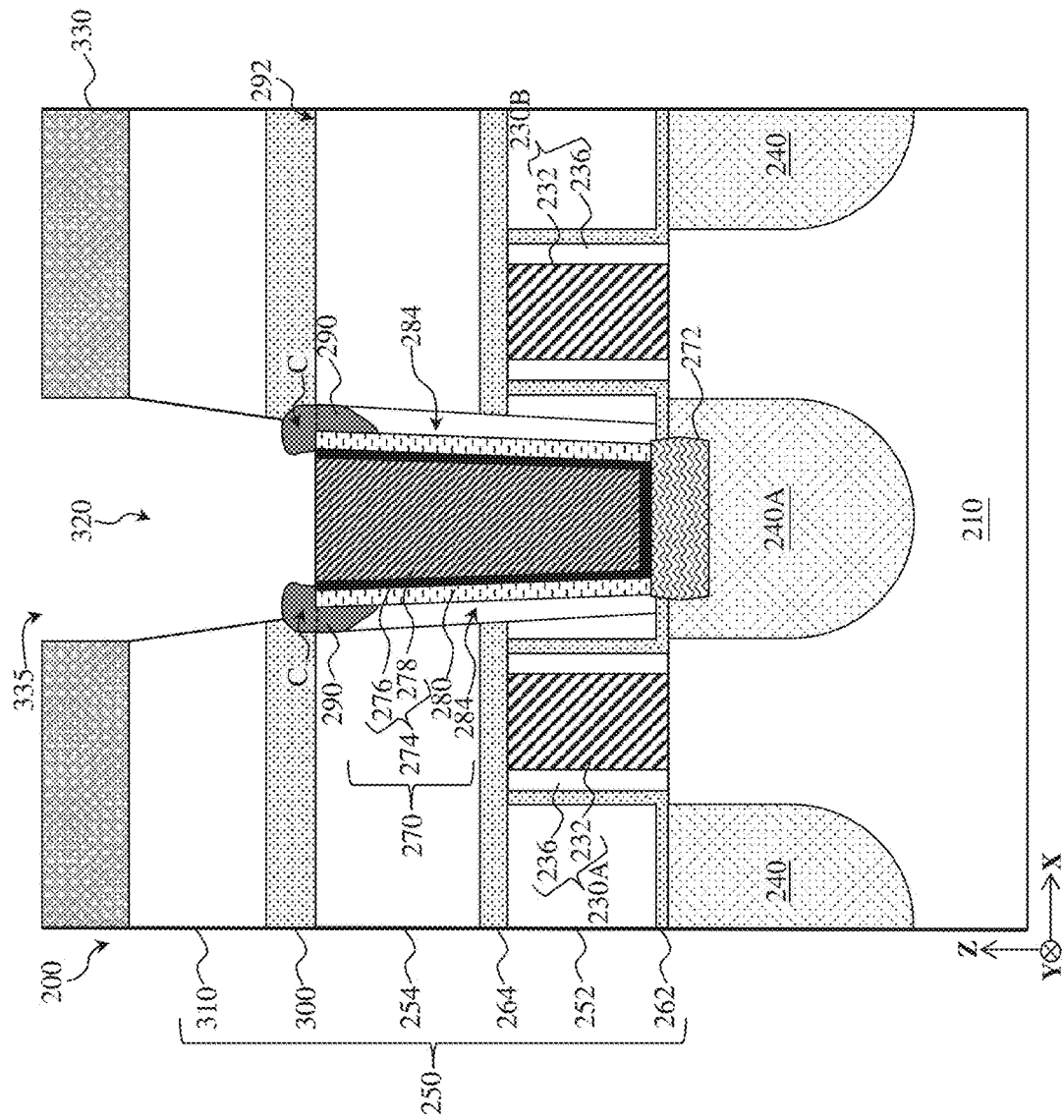

Turning to FIG. 6, the insulating layer of MLI feature 250 is patterned to form an interconnect opening that exposes interconnect 270. Via opening 320 extends through ILD layer 310 and CESL 300 to expose interconnect 270, particularly source/drain contact 274. Via opening 320 has sidewalls defined by ILD layer 310 and CESL 300 and a bottom defined by interconnect 270. Because air gap seal 290 has segment C above top surface 292 of ILD layer 254, via opening 320 is further defined by and exposes air gap seal 290. In FIG. 6, via opening 320 has a trapezoidal shape, though the present disclosure contemplates via opening 320 having other shapes, such as a rectangular shape. In some embodiments, forming via opening 320 includes performing a lithography process to form a patterned mask layer 330 (having an opening 335 therein that overlaps interconnect 270) over ILD layer 310 and performing an etching process to transfer a pattern defined in patterned mask layer 330 to ILD layer 310 and CESL 300. The lithography process can include forming a resist layer on ILD layer 310 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern (for example, an opening that overlaps interconnect 270) that corresponds with the mask. In some embodiments, the patterned resist layer is patterned mask layer 330. In some embodiments, the patterned resist layer is formed over a mask layer deposited over ILD layer 310, and the patterned resist layer is used as an etch mask to remove portions of the mask layer, thereby forming patterned mask layer 330. Alternatively, the exposure process can be implemented or replaced by other methods, such as maskless lithography, electron-beam writing, ion-beam writing, and/or nanoimprint technology.

The etch process uses patterned mask layer 330 as an etch mask to remove portions of ILD layer 310 and/or CESL 300, thereby exposing interconnect 270 (for example, source/drain contact 274). The etch process is configured to selectively remove ILD layer 310 and CESL 300 with respect to air gap seal 290 and source/drain contact 274. In other words, the etch process substantially removes ILD layer 310 and CESL 300 but does not remove, or does not substantially remove, air gap seal 290 and source/drain contact 274. Various etch parameters can be tuned to achieve selective etching of ILD layer 310 and CESL 300, such as etchant composition, etch temperature, etch solution concentration, etch time, etch pressure, source power, RF bias voltage, RF bias power, etchant flow rate, other suitable etch parameters, or combinations thereof. For example, an etchant is selected for the etching process that etches the material of ILD layer 310 and CESL 300 (in the depicted embodiment, silicon oxide and silicon nitride) at a higher rate than the material of air gap seal 290 and source/drain contact 274 (in the depicted embodiment, amorphous silicon and metal) (i.e., the etchant has a high etch selectivity with respect to the material of ILD layer 310 and CESL 300). The etch process is a dry etching process, a wet etching process, other suitable etching process, or combinations thereof. A dry etching process may implement a hydrogen-comprising etch gas, an oxygen-comprising etch gas, a fluorine-comprising etch gas (for example, $CF_4$, $SF_6$, $CH_2F_2$, $CHF_3$, and/or $C_2F_6$), a chlorine-comprising etch gas (for example, $Cl_2$, $CHCl_3$, $CCl_4$, and/or $BCl_3$), a bromine-comprising etch gas (for example, HBr and/or $CHBr_3$), an iodine-comprising etch gas, other suitable etch gases and/or etch plasmas, or combinations thereof. A wet etching process may implement a wet etchant solution that includes DHF, KOH, $NH_4OH$, $NH_3$, HF, $HNO_3$, $CH_3COOH$, $H_2O$, other suitable wet etchant solution constituents, or combinations thereof. In some embodiments, the etch process is a multi-step etch process that includes a first etch step that selectively etches ILD 310 and a second etch step that selectively etches CESL 300. For example, the first etch step is configured to remove ILD layer 310 but not remove, or not substantially remove, CESL 300, while the second etch step is configured to remove CESL 300 but not remove, or not substantially remove, ILD 310, air gap seal 290, and source/drain contact 274. In some embodiments, the first etch step is a dry etching process that utilizes an etch gas that includes $CF_4$, $O_2$, and/or $N_2$ to selectively etch ILD layer 310. In such embodiments, a ratio of $CH_4$ to $O_2$ and/or $N_2$, an etch temperature, and/or an RF power may be tuned to achieve desired etch selectively. In some embodiments, the first etch step is a wet etching process that utilizes a wet etchant solution that includes HF to selectively etch ILD layer 310. In such embodiments, an etch temperature and/or an etch time (for example, how long IC device 200 is submersed in the wet etchant solution) may be tuned to achieve desired etch selectively. In some embodiments, the second etch step is a dry etching process that utilizes an etch gas that includes $SF_6$, $CH_4$, $H_2$, $O_2$, and/or $N_2$ to selectively etch CESL 300. In such embodiments, a ratio of $SF_6$ to $CH_4$, $O_2$, and/or $N_2$, a ratio of $CH_4$ to $H_2$, $O_2$, and/or $N_2$, an etch temperature, and/or an RF power may be tuned to achieve desired etch selectively. In some embodiments, the second etch step is a wet etching process that utilizes a wet etchant solution that includes $H_3PO_4$ and $H_2O$ to selectively etch CESL 300. In such embodiments, a ratio of the $H_3PO_4$ to $H_2O$, an etch temperature, and/or an etch time (for example, how long IC device 200 is submersed in the wet etchant solution) may be tuned to achieve desired etch selectively. In some embodiments, after the etching process, patterned mask layer 330 is removed from ILD layer 310 (in some embodiments, by a resist stripping process). In some embodiments, patterned mask layer 330 is removed during etching of ILD layer 310 and/or CESL 300.

Because air gap seal 290 and the insulating layer of MLI feature 250 (here, ILD layer 310 and CESL 300) include materials that facilitate high etching selectivity during formation of via opening 320, air gap seal 290 remains intact and preserves reliability of air gap 284 for capacitance and/or resistance reduction purposes. For example, air gap seal 290 can withstand misalignment issues and/or over-size interconnect issues that sometimes arise when forming a via to interconnect 270. With misalignment issues, via opening 320 may not align and/or overlay interconnect 270, as depicted, and instead may be shifted left or right, such that via opening 320 significantly overlaps air spacer 284 and exposes portions of air gap seal 290 that close air spacer 284. With over-size interconnect issues, a width of a via is intentionally (or, sometimes, unintentionally) configured wider than interconnect 270, such that via opening 320 significantly overlaps air spacer 284 and exposes portions of air gap seal 290 that close air spacer 284. With both issues, conventional air gap seals, which often include materials that do not facilitate sufficiently high etching selectivity, may be removed during the etching processes used to form via opening 320, thereby exposing air gap 284 to conductive materials subsequently deposited in via opening 320. In contrast, in the depicted embodiment, because air gap seal 290 includes amorphous silicon and the etching process used to form via opening 320 has a high etching selectivity, air gap seal 290 remains intact during formation of via opening 320. Air gap seal 290 thus effectively prevents conductive materials (for example, metal) from entering air gap 284, such as those deposited in via opening 320 to form the via over interconnect 270.

Figure 7:
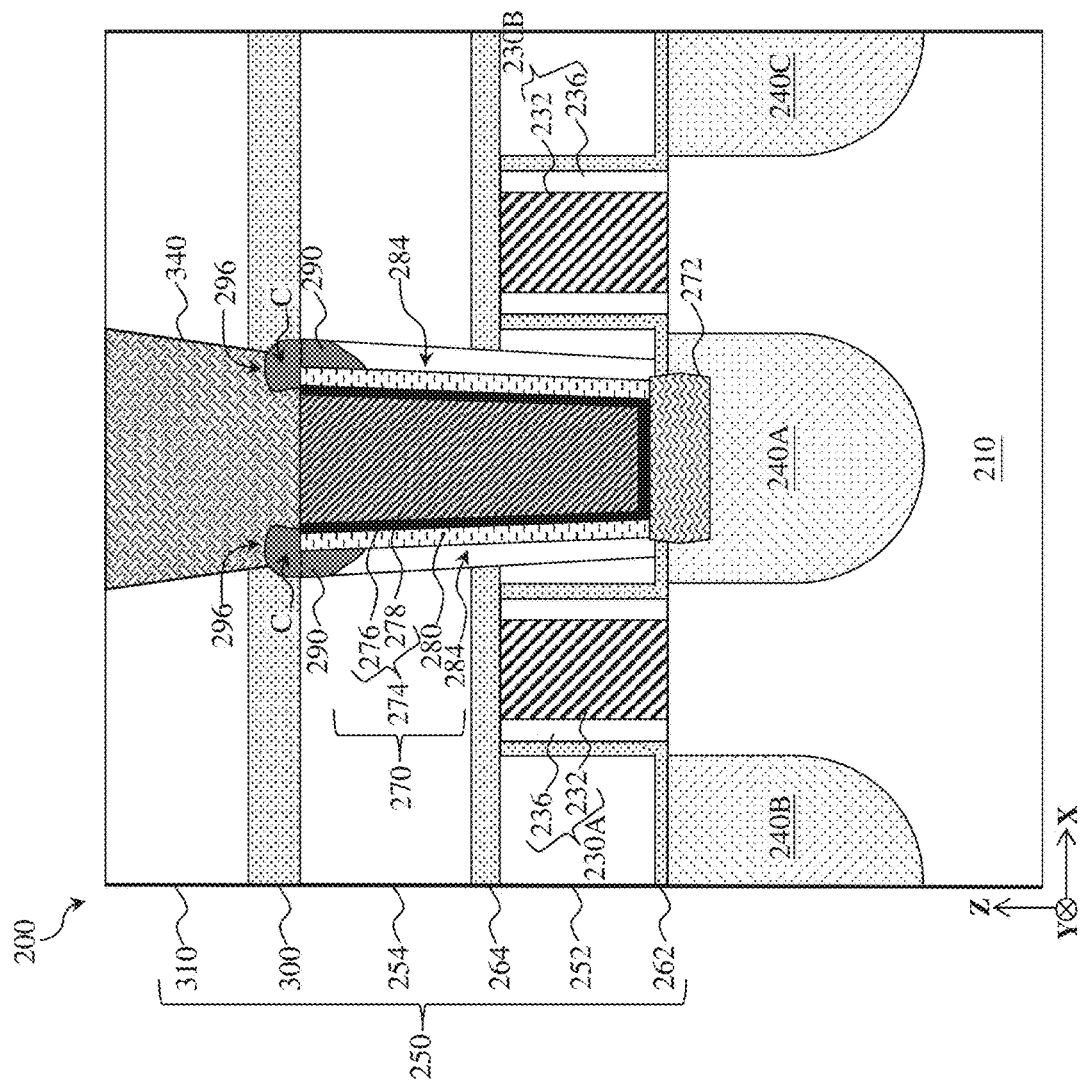

Turning to FIG. 7, an interconnect is formed in the interconnect opening. For example, a via 340 is formed in via opening 320. Via 340 extends through ILD layer 310 and CESL 300 to source/drain contact 274, though the present disclosure contemplates embodiments where via 340 extends through more than one ILD layer and/or CESL of MLI feature 250. In the depicted embodiment, via 340 is disposed on source/drain contact 274 and air gap seal 290 (in particular, on a portion of top surface 296 of air gap seal 290), and a portion of via 340 is disposed between air gap seal 290. Via 340 electrically couples and/or physically couples source/drain contact 274 to a conductive feature of MLI feature 250, such as a conductive line of a metal layer of MLI feature 250 (for example, a metal one (M1) layer). Via 340 is formed by any suitable process and has any suitable configuration. For example, one or more conductive layers (for example, metal layers) are deposited in via opening 320. In some embodiments, via 340 includes a via barrier layer (also referred to as a via liner layer) and a via bulk layer. In such embodiments, the via barrier layer is deposited over surfaces of ILD layer 310, CESL 300, air gap seal 290, and source/drain contact 274 that define via opening 320, and the via bulk layer is deposited over the via barrier layer. The via barrier layer may partially fill via opening 320, and in some embodiments, is conformally deposited, such that a thickness of the via barrier layer is substantially uniform along the various surfaces defining via opening 320. The via bulk layer may fill a remaining portion of via opening 320. In some embodiments, the via barrier layer and/or the via bulk layer are deposited by PVD, CVD, ALD, electroplating, electroless plating, other suitable deposition process, or combinations thereof. Thereafter, any excess conductive material(s) (for example, any of the via barrier layer and/or the via bulk layer that are disposed over a top surface of ILD layer 310) can be removed by a planarization process, such as a CMP process, thereby planarizing a top surface of ILD layer 310 and via 340.

The via barrier layer includes a material that promotes adhesion between a dielectric material (here, ILD layer 310 and/or CESL 300) and the via bulk layer. For example, the via barrier layer includes titanium, titanium alloy, tantalum, tantalum alloy, cobalt, cobalt alloy, ruthenium, ruthenium alloy, molybdenum, molybdenum alloy, other suitable constituent configured to promote and/or enhance adhesion between a metal material and a dielectric material, or combinations thereof. In some embodiments, the via barrier layer includes tantalum and nitrogen (for example, tantalum nitride) or titanium and nitrogen (for example, titanium nitride). In some embodiments, the via barrier layer includes multiple layers. For example, the via barrier layer may include a first sub-layer that includes titanium and a second sub-layer that includes titanium nitride. In another example, the via barrier layer may include a first sub-layer that includes tantalum and a second sub-layer that includes tantalum nitride. The via bulk layer includes tungsten, ruthenium, cobalt, copper, aluminum, iridium, palladium, platinum, nickel, low resistivity metal constituent, alloys thereof, or combinations thereof. In some embodiments, via 340 is a barrier-free via, and thus includes only the via bulk layer. In some embodiments, via 340 is a partially barrier-free via, and thus includes via barrier layer between only a portion of the via bulk layer and its surrounding layers (for example, ILD layer 310, CESL 300, air gap seal 290, and/or source/drain contact 274).

Figure 8A:
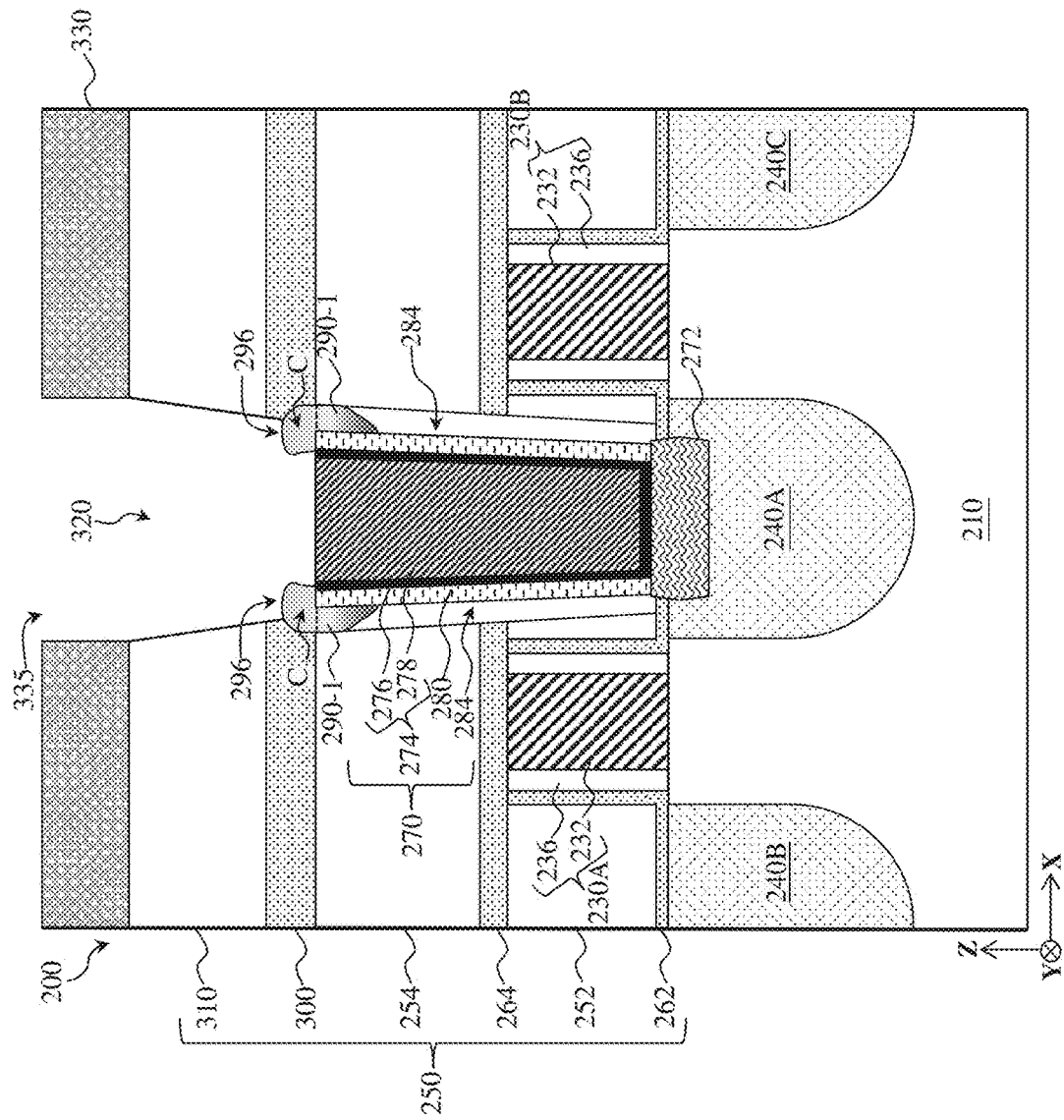
FIG. 8A and FIG. 8B are fragmentary diagrammatic views of the integrated circuit device, in portion or entirety, at various stages of fabricating the interconnect, such as the method for fabricating an interconnect of an integrated circuit device of FIG. 1, according to various aspects of the present disclosure.
Figure 8B:
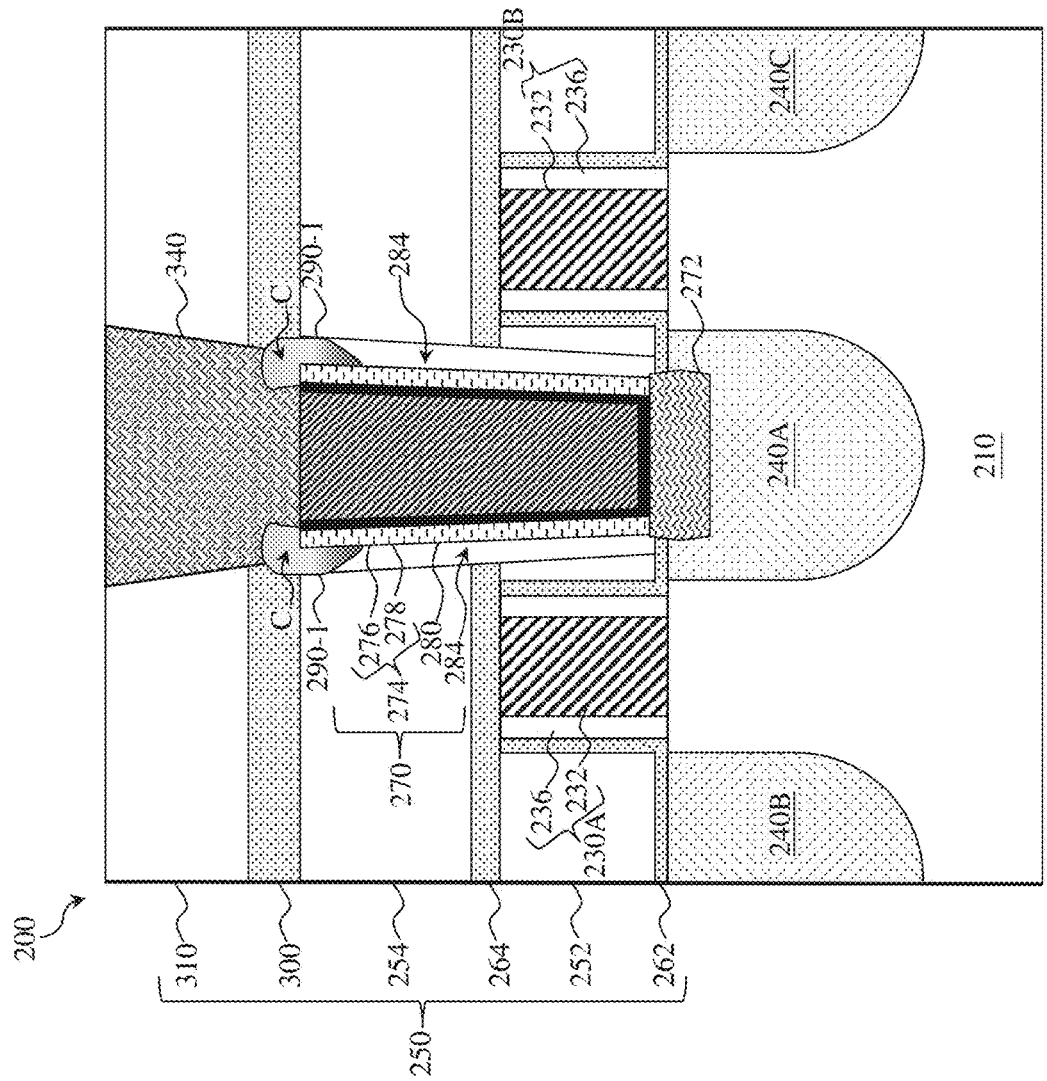

Turning to FIG. 8A and FIG. 8B, in some embodiments, to further reduce capacitance and/or resistance between source/drain contact 274 and gate structures 230A, 230B, air gap seal 290 undergoes oxidation before forming via 340. For example, in FIG. 8A, after forming via opening 320, an oxidation process is performed to oxidize air gap seal 290, thereby forming oxidized air gap seal 290-1. In some embodiments, oxidized air gap seal 290-1 is partially oxidized, such that oxidized air gap seal 290-1 includes amorphous silicon portions and silicon oxide portions. In some embodiments, oxidized air gap seal 290-1 is completely oxidized, such that oxidized air gap seal 290-1 includes silicon oxide and is free of amorphous silicon. In some embodiments, the oxidation process includes performing a thermal treatment that oxidizes air gap seal 290. For example, air gap seal 290 is exposed to a temperature of about room temperature (for example, about 20° C. to about 25° C.) to about 700° C. In some embodiments, the oxidation process includes performing a plasma treatment that oxidizes air gap seal 290. For example, air gap seal 290 is exposed to an oxygen-comprising plasma, such as a nitrous oxide ($N_2O$) plasma. In some embodiments, the plasma treatment is performed for at a temperature of about room temperature to about 500° C. In some embodiments, the oxygen-comprising plasma is generated by electron cyclotron resonance (ECR) techniques or RF techniques. In some embodiments, the oxidation process includes performing an ozonated water ($DIO_3$) clean treatment that oxidizes air gap seal 290. For example, air gap seal 290 is exposed to a solution of ozone in deionized water. In some embodiments, the $DIO_3$ clean treatment partially oxidizes air gap seal 290, such as an outer portion of air gap seal 290, such that air gap seal 290-1 includes an outer silicon oxide portion, such as an outer silicon oxide layer, and an inner amorphous silicon portion. In some embodiments, the outer silicon oxide portion is formed only on portions of the air gap seal 290 that are exposed by via opening 320. For example, in some embodiments, the outer silicon oxide portion is disposed along only the portion of top surface 296 exposed by via opening 320. In some embodiments, a thickness of the outer silicon oxide layer is less than about 0.5 nm. In some embodiments, the $DIO_3$ clean treatment is performed at a temperature of about room temperature to about 100° C. In some embodiments, the $DIO_3$ clean treatment is performed for a time of about 10 seconds to about 10 minutes.

The present disclosure provides for many different embodiments. Interconnects that facilitate reduced capacitance and/or resistance and corresponding techniques for forming the interconnects are disclosed herein. An exemplary interconnect is disposed in an insulating layer. The interconnect has a metal contact, a contact isolation layer surrounding sidewalls of the metal contact, and an air gap disposed between the contact isolation layer and the insulating layer. An air gap seal for the air gap has a first portion disposed over a top surface of the contact isolation layer, but not disposed on a top surface of the insulating layer, and a second portion disposed between the contact isolation layer and the insulating layer, such that the second portion surrounds a top portion of sidewalls of the metal contact. The air gap seal may include amorphous silicon and/or silicon oxide. The contact isolation layer may include silicon nitride. The insulating layer may include silicon oxide. In some embodiments, the second portion of the air gap seal has a first segment disposed over a second segment. The first segment may have a substantially uniform thickness and the second segment may have a tapered thickness.

In some embodiments, the insulating layer includes a first etch stop layer, a first interlayer dielectric layer disposed over the first etch stop layer, a second etch stop layer disposed over the first interlayer dielectric layer, and a second interlayer dielectric layer disposed over the second contact etch stop layer. In such embodiments, the air gap extends through the second interlayer dielectric layer, the second etch stop layer, and the first interlayer dielectric layer to the first etch stop layer. In such embodiments, the second portion of the air gap seal is disposed between the contact isolation layer and the second interlayer dielectric layer. In some embodiments, the device further includes a third etch stop layer disposed over the second interlayer dielectric layer and a third interlayer dielectric layer disposed over the third etch stop layer. In such embodiments, a top surface of the air gap seal may be lower than a top surface of the third etch stop layer. In some embodiments, the interconnect is a first interconnect, and the device further includes a second interconnect disposed on the first interconnect. In such embodiments, the first portion of the air gap seal may be disposed between the contact isolation layer and the second interconnect. In such embodiments, the first portion of the air gap seal may further be disposed between a portion of the metal contact and the second interconnect.

An exemplary device includes a first insulating layer disposed over a substrate and a device-level contact disposed in the first insulating layer. A dielectric layer is disposed along sidewalls of the device-level contact. An air gap seal is disposed between the first insulating layer and a first portion of the dielectric layer that is disposed along the sidewalls of the device-level contact. An air gap is disposed between the first insulating layer, a second portion of the dielectric layer that is disposed along the sidewalls of the device-level contact, and the air gap seal. The device further includes a second insulating layer disposed over the first insulating layer, the device-level contact, the dielectric layer, and the air gap seal. A via is disposed in the second insulating layer over the device-level contact. In such embodiments, a material of the air gap seal is different than a material of the dielectric layer, a material of the first insulating layer, and a material of the second insulating layer. In some embodiments, the material of the air gap seal includes amorphous silicon, the material of the dielectric layer includes silicon and nitrogen, the material of the first insulating layer includes silicon and oxygen, and the material of the second insulating layer includes silicon and oxygen. In some embodiments, the material of the air gap seal includes a first portion that includes the amorphous silicon and a second portion that includes silicon and oxygen. In some embodiments, the air gap seal is disposed over a top surface of the dielectric layer while a top surface of the first insulating layer is free of the air gap seal. In some embodiments, the second insulating layer includes a contact etch stop layer (CESL) and an interlayer dielectric layer (ILD) disposed over the CESL. In some embodiments, the CESL physically contacts a portion of a top surface of the air gap seal. In some embodiments, a thickness of the air gap seal defined between a top surface of the first insulating layer and the top surface of the air gap seal is less than a thickness of the CESL.

An exemplary method includes forming an interconnect in a first insulating layer. The interconnect includes a metal contact, a contact isolation layer disposed along sidewalls of the metal contact, and a dummy contact layer disposed along the sidewalls of the metal contact. The dummy contact layer is disposed between the first insulating layer and the contact isolation layer. The method further includes removing the dummy contact layer from the interconnect to form an air gap along the sidewalls of the metal contact. The air gap is disposed between the first insulating layer and the contact isolation layer. The method further includes sealing the air gap by performing a deposition process that selectively deposits an air gap seal material on the contact isolation layer without depositing the air gap seal material on the first insulating layer. In some embodiments, the interconnect is a first interconnect, and the method further includes, after sealing the air gap, forming a second insulating layer over the first interconnect and the first insulating layer. The method further includes forming an interconnect opening in the second insulating layer that exposes the first interconnect and forming a second interconnect in the interconnect opening. In some embodiments, the method further includes oxidizing at least a portion of the air gap seal material before forming the second interconnect. In some embodiments, forming the interconnect opening includes etching the second insulating layer without etching the air gap seal material. In some embodiments, performing the deposition process that selectively deposits the air gap seal material on the contact isolation layer without depositing the air gap seal material on the first insulating layer includes forming amorphous silicon on silicon nitride surfaces.

Another exemplary device includes a first insulating layer disposed over a substrate; a source/drain contact disposed in the first insulating layer; an isolation layer disposed along sidewalls of the source/drain contact; an air gap seal disposed between the first insulating layer and a first portion of the isolation layer disposed along the sidewalls of the source/drain contact; an air gap disposed between the first insulating layer, a second portion of the isolation layer disposed along the sidewalls of the source/drain contact, and the air gap seal; a second insulating layer disposed over the source/drain contact, the isolation layer, the first insulating layer, and the air gap seal; and a via disposed in the second insulating layer over the source/drain contact. In some embodiments, a material of the air gap seal is different than a material of the isolation layer, a material of the first insulating layer, and a material of the second insulating layer.

In some embodiments, the material of the air gap seal includes amorphous silicon, the material of the isolation layer includes silicon and nitrogen, the material of the first insulating layer includes silicon and oxygen, and the material of the second insulating layer includes silicon and oxygen. In some embodiments, the air gap seal is disposed over a top surface of the isolation layer while a top surface of the first insulating layer is free of the air gap seal. In some embodiments, a portion of the air gap seal has a thickness that is substantially equal to a width of the air gap. In some embodiments, the via contacts the air gap seal. In some embodiments, the air gap seal has a tapered bottom surface, such that the air gap seal has a tapered thickness. In some embodiments, the second insulating layer includes a contact etch stop layer (CESL) and an interlayer dielectric layer (ILD) disposed over the CESL, wherein the CESL contacts the air gap seal. In some embodiments, a thickness of the air gap seal defined between a top surface of the first insulating layer and a top surface of the air gap seal is less than a thickness of the CESL.

Another exemplary method includes forming a source/drain contact structure in a first insulating layer, wherein the source/drain contact structure includes a source/drain contact, an isolation layer disposed along sidewalls of the source/drain contact, and a dummy layer disposed along the isolation layer, such that the dummy layer is disposed between the first insulating layer and the isolation layer; forming an air gap by removing the dummy layer, wherein the air gap is disposed between the first insulating layer and the isolation layer; forming an air gap seal over the air gap by depositing an air gap seal material on the isolation layer, wherein the air gap seal material is different than a material of the isolation layer and a material of the first insulating layer; forming a second insulating layer over the source/drain contact structure, the first insulating layer, and the air gap seal, wherein a material of the second insulating layer is different than the material of the air gap seal material; and forming a via in the second insulating layer, wherein the via is disposed over and contacts the source/drain contact. In some embodiments, forming the via includes performing an etching process that etches the second insulating layer without etching the air gap seal to form a via trench exposing the source/drain contact, and filling the via trench with metal. In some embodiments, an etch rate of the material of the second insulating layer to an etchant of the etching process is greater than an etch rate of the air gap seal material of the air gap seal to the etchant of the etching process. In some embodiments, the method further includes oxidizing at least a portion of the air gap seal before filling the via trench. In some embodiments, forming the air gap seal over the air gap by depositing the air gap seal material on the isolation layer includes selectively growing the air gap seal material on the isolation layer without growing the air gap seal material on the first insulating layer. In some embodiments, the air gap seal material includes amorphous silicon, the material of the isolation layer includes silicon and nitrogen, and the material of the first insulating layer includes silicon and oxygen. In some embodiments, forming the air gap by removing the dummy layer includes performing an etching process that etches the dummy layer without etching the isolation layer and the first insulating layer. In some embodiments, forming the air gap seal over the air gap by depositing the air gap seal material on the isolation layer includes filling a top portion of the air gap, such that the air gap seal material fills a portion of the air gap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming an interconnect in an insulating layer, wherein the interconnect includes a metal contact, a contact isolation layer disposed along sidewalls of the metal contact, and a dummy contact layer disposed along the sidewalls of the metal contact, wherein the dummy contact layer is disposed between the insulating layer and the contact isolation layer;
    removing the dummy contact layer from the interconnect to form an air gap along the sidewalls of the metal contact, wherein the air gap is disposed between the insulating layer and the contact isolation layer; and
    sealing the air gap by performing a deposition process that selectively deposits an air gap seal material on the contact isolation layer without depositing the air gap seal material on the insulating layer.

2. The method of claim 1, further comprising performing an oxidation process to oxidize at least a portion of the air gap seal material.

3. The method of claim 1, wherein the performing the deposition process that selectively deposits the air gap seal material on the contact isolation layer includes forming amorphous silicon on silicon nitride surfaces.

4. The method of claim 1, wherein the removing the dummy contact layer includes:
    etching the dummy contact layer without etching the contact isolation layer and the insulating layer; and
    wherein an etch rate of the dummy contact layer to an etch rate of the contact isolation layer is about 10:1 to about 1,000:1 and an etch rate of the dummy contact layer to an etch rate of the insulating layer is about 10:1 to about 1,000:1.

5. The method of claim 1, wherein:
    a first portion of the air gap seal material disposed between the contact isolation layer and the insulation layer has a substantially uniform thickness;
    a second portion of the air gap seal material disposed between the contact isolation layer and the insulation layer has a tapered thickness; and
    the first portion is over the second portion.

6. The method of claim 1, wherein the interconnect is a first interconnect, the insulating layer is a first insulating layer, and the method further comprises:
    after the sealing the air gap, forming a second insulating layer over the first interconnect, the air gap seal material, and the first insulating layer;
    forming an interconnect opening in the second insulating layer that exposes the first interconnect; and
    forming a second interconnect in the interconnect opening.

7. The method of claim 6, further comprising oxidizing at least a portion of the air gap seal material before forming the second interconnect.

8. The method of claim 6, wherein the forming the interconnect opening includes etching the second insulating layer without etching the air gap seal material.

9. The method of claim 8, wherein an etch rate of the air gap seal material to an etch rate of the second insulating layer is about 1:10 to about 1:1,000.

10. A method comprising:
    forming a device-level contact in a first insulating layer, wherein a dielectric layer and a sacrificial layer are between sidewalls of the device-level contact and the first insulating layer;
    selectively removing the sacrificial layer to form an air gap between the first insulating layer and the dielectric layer;
    selectively depositing an air gap seal between the first insulating layer and a first portion of the dielectric layer, wherein the air gap remains between the first insulating layer and a second portion of the dielectric layer;
    forming a second insulating layer over the first insulating layer, the device-level contact, the dielectric layer, and the air gap seal;
    forming a via in the second insulating layer over the device-level contact; and
    wherein a material of the air gap seal is different than a material of the dielectric layer, a material of the first insulating layer, and a material of the second insulating layer.

11. The method of claim 10, wherein the material of the air gap seal includes amorphous silicon, the material of the dielectric layer includes silicon and nitrogen, the material of the first insulating layer includes silicon and oxygen, and the material of the second insulating layer includes silicon and oxygen.

12. The method of claim 10, wherein the selectively depositing the air gap seal includes performing a chemical vapor deposition (CVD) process and tuning parameters of the CVD process to grow an air gap seal material on surfaces of the dielectric layer faster than on surfaces of the first insulating layer.

13. The method of claim 12, wherein the CVD process uses a silane precursor.

14. The method of claim 10, wherein the air gap seal has a portion above the first insulating layer having a first thickness and the forming the second insulating layer includes:
    forming a contact etch stop layer (CESL) having a second thickness, wherein the second thickness is greater than the first thickness; and
    forming an interlayer dielectric layer (ILD) over the CESL.

15. The method of claim 10, further comprising performing an oxidation process on the air gap seal before forming the via.

16. A method comprising:
    forming a source/drain contact structure that extends through a first dielectric layer to an epitaxial source/drain structure;
    removing a portion of the source/drain contact structure to form an air gap between the first dielectric layer and a second dielectric layer of the source/drain contact structure, wherein the air gap extends along sidewalls of the source/drain contact structure; and forming an amorphous silicon structure that wraps top corners of the second dielectric layer, wherein the amorphous silicon structure is disposed between the first dielectric layer and the second dielectric layer of the source/drain contact structure.

17. The method of claim 16, further comprising oxidizing the amorphous silicon structure, such that the amorphous silicon structure includes amorphous silicon portions and silicon oxide portions.

18. The method of claim 16, wherein the forming the amorphous silicon structure includes reducing a length of the air gap.

19. The method of claim 16, further comprising forming a via on the source/drain contact structure, wherein the via extends through the amorphous silicon structure.

20. The method of claim 19, wherein the via is disposed on a top surface and a sidewall surface of the amorphous silicon structure.

* * * * *